United States Patent
Kaneko et al.

(10) Patent No.: US 8,385,099 B2
(45) Date of Patent: Feb. 26, 2013

(54) SEMICONDUCTOR MEMORY CELL AND MANUFACTURING METHOD THEREOF, AND SEMICONDUCTOR MEMORY DEVICES

(75) Inventors: Yukihiro Kaneko, Osaka (JP); Yoshihisa Kato, Shiga (JP); Hiroyuki Tanaka, Kyoto (JP)

(73) Assignee: Panasonic Corporation, Osaka (JP)

( * ) Notice: Subject to any disclaimer, the term of this patent is extended or adjusted under 35 U.S.C. 154(b) by 37 days.

(21) Appl. No.: 13/211,983

(22) Filed: Aug. 17, 2011

(65) Prior Publication Data

US 2011/0299318 A1 Dec. 8, 2011

Related U.S. Application Data

(63) Continuation of application No. PCT/JP2009/005595, filed on Oct. 23, 2009.

(30) Foreign Application Priority Data

Feb. 24, 2009 (JP) ................................ 2009-040878
Mar. 9, 2009 (JP) ................................ 2009-054919
May 18, 2009 (JP) ................................ 2009-119619

(51) Int. Cl.
*G11C 11/22* (2006.01)

(52) U.S. Cl. ......... 365/145; 365/109; 365/117; 365/177
(58) Field of Classification Search .................. 365/145, 365/109, 117, 177
See application file for complete search history.

(56) References Cited

U.S. PATENT DOCUMENTS

| 5,248,564 A | 9/1993 | Ramesh |
| 5,345,414 A | 9/1994 | Nakamura |
| 5,541,870 A * | 7/1996 | Mihara et al. ................. 365/145 |
| 5,723,885 A | 3/1998 | Ooishi |
| 5,751,037 A | 5/1998 | Aozasa et al. |
| 6,054,734 A | 4/2000 | Aozasa et al. |
| 6,225,655 B1 * | 5/2001 | Moise et al. .................. 257/295 |
| 6,344,660 B1 * | 2/2002 | Dimitrakopoulos et al. ... 257/40 |
| 6,532,165 B1 * | 3/2003 | Katori ........................... 365/145 |
| 7,187,575 B2 * | 3/2007 | Kijima et al. ................. 365/145 |

(Continued)

FOREIGN PATENT DOCUMENTS

| GB | 2 367 424 A | 4/2002 |
| JP | 05-205487 | 8/1993 |

(Continued)

OTHER PUBLICATIONS

T. Fukushima et al., "Electrical Characteristics of Controlled-Polarization-Type Ferroelectric-Gate Field-Effect translator," Japanese Journal of Applied Physics, 2008, vol. 47, No. 12, pp. 8874-8879.

*Primary Examiner* — Pho M Luu
(74) *Attorney, Agent, or Firm* — McDermott Will % Emery LLP

(57) ABSTRACT

A semiconductor memory cell includes: a memory element formed by a first field effect transistor having a gate insulating film made of a ferroelectric film; and a select switching element formed by a second field effect transistor having a gate insulating film made of a paraelectric film. The ferroelectric film and the paraelectric film are stacked together with a semiconductor film of a compound semiconductor interposed therebetween. A first gate electrode of the first field effect transistor is formed on a side of the ferroelectric film, and a second gate electrode of the second field effect transistor is formed on a side of the paraelectric film so as to face the first gate electrode. The semiconductor film forms a common channel layer of the first and second field effect transistors.

22 Claims, 26 Drawing Sheets

U.S. PATENT DOCUMENTS

| | | | |
|---|---|---|---|
| 7,842,989 B2 * | 11/2010 | Kato | 257/295 |
| 2003/0218644 A1 | 11/2003 | Higuchi et al. | |
| 2006/0138520 A1 | 6/2006 | Kang et al. | |
| 2008/0237695 A1 | 10/2008 | Shino et al. | |
| 2009/0173978 A1 | 7/2009 | Kato | |

FOREIGN PATENT DOCUMENTS

| | | |
|---|---|---|
| JP | 06-097452 | 4/1994 |
| JP | 07-161854 | 6/1995 |
| JP | 08-335645 | 12/1996 |
| JP | 09-97851 | 4/1997 |
| JP | 2923361 | 7/1999 |
| JP | 2000-340759 | 12/2000 |
| JP | 2004-002150 | 1/2004 |
| JP | 2006-190933 | 7/2006 |
| JP | 2008-091492 | 4/2008 |
| JP | 2008-166486 | 7/2008 |
| JP | 2008-263019 | 10/2008 |
| JP | 2008-270313 | 11/2008 |
| JP | 2009-164473 | 7/2009 |

* cited by examiner

| MFSFET | MISFET | READ CURRENT |
|--------|--------|--------------|
| ON | ON | HIGH |
| ON | OFF | HIGH |
| OFF | ON | HIGH |
| OFF | OFF | LOW |

FIG.6A    FIG.6B
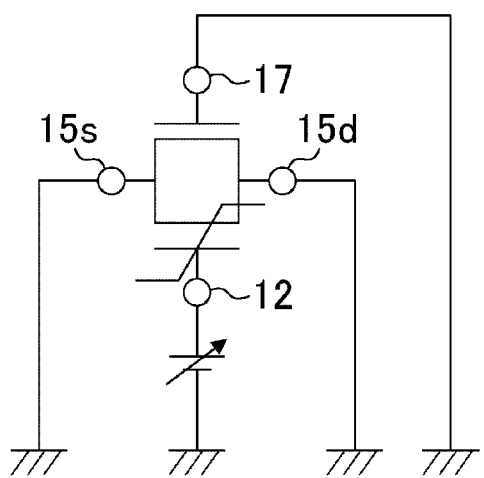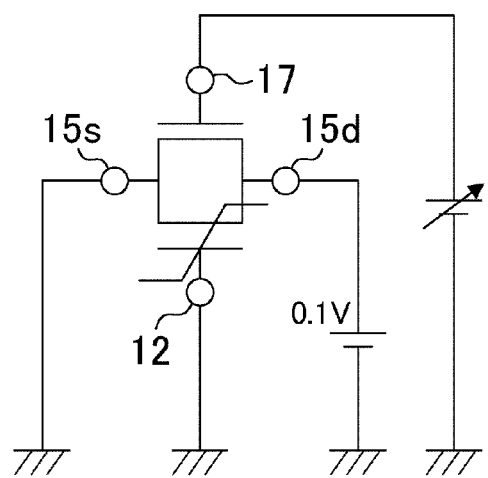
FIG.6C
|  | MISFET ON | MISFET OFF |
|---|---|---|
| MFSFET ON | $2.4 \times 10^{-6}$ A | $9.2 \times 10^{-7}$ A |
| MFSFET OFF | $3.9 \times 10^{-7}$ A | $< 1.0 \times 10^{-9}$ A |

# SEMICONDUCTOR MEMORY CELL AND MANUFACTURING METHOD THEREOF, AND SEMICONDUCTOR MEMORY DEVICES

CROSS-REFERENCE TO RELATED APPLICATION

This is a continuation of PCT International Application PCT/JP2009/005595 filed on Oct. 23, 2009, which claims priority to Japanese Patent Application No. 2009-040878 filed on Feb. 24, 2009, Japanese Patent Application No. 2009-054919 filed on Mar. 9, 2009, and Japanese Patent Application No. 2009-119619 filed on May 18, 2009. The disclosures of these applications including the specifications, the drawings, and the claims are hereby incorporated by reference in their entirety.

BACKGROUND

The present invention relates to semiconductor memory cells including a memory element formed by a field effect transistor having a gate insulating film made of a ferroelectric film, and semiconductor memory devices having semiconductor memory cells arranged in an array.

Nonvolatile memories using a ferroelectric material are roughly divided into two types, namely a capacitor type and a field effect transistor (FET) type having a gate insulating film made of a ferroelectric film.

The capacitor type ferroelectric memories have a structure similar to that of dynamic random access memories (DRAMs). The capacitor type ferroelectric memories hold charge in a ferroelectric capacitor, and distinguish between "0" and "1" of information according to the polarization direction of the ferroelectric material. The polarization accumulated in the ferroelectric capacitor is coupled with charge that is induced by electrodes respectively located above and below the polarization, and does not disappear in the state where the voltage is cut off. However, when reading information, the stored polarization is destroyed, and the information is lost. Thus, a rewrite operation of the information is required. Since the rewrite operation is performed in every read operation, polarization reversal is repeatedly caused in every rewrite operation, resulting in fatigue and degradation of the polarization. In addition, since polarization charge is read by a sense amplifier in the structure, the amount of charge (typically 100 fC) needs to be at least the detection limit of the sense amplifier. Each ferroelectric material has unique polarization charge per unit area. Thus, even when miniaturizing memory cells, a certain electrode area is required as long as the same material is used. It is therefore difficult to reduce the capacitor size in proportion to the miniaturization of process rules, and the capacitor type ferroelectric memories are not suitable for increased capacitance.

In the FET type ferroelectric memories, however, information is read by detecting the conduction state of the channel that changes according to the polarization orientation of the ferroelectric film. This allows the information to be read in a non-destructive manner. Moreover, the amplitude of an output voltage can be increased by the amplifying operation of the FET, whereby miniaturization depending on the scaling law can be implemented. Conventionally, FET-type transistors have been proposed in which a ferroelectric film serving as a gate insulating film is formed on a silicon substrate serving as a channel. This structure is called a "metal-ferroelectric-semiconductor (MFS) FET."

In a memory array having FET-type ferroelectric memories arranged in a matrix of rows and columns, an operation of writing binary data to the ferroelectric memory is performed by applying a voltage pulse between a gate electrode connected to a word line of a selected memory cell and a source electrode connected to a source line. However, at this time, the voltage is applied to those memory cells that are not to be accessed and are connected to the word line and the source line of the selected memory cell, causing erroneous writing of the data. Accordingly, a select switch, which is formed by, e.g., a metal-insulator-semiconductor FET (MISFET), is typically inserted between the word line and the gate electrode and/or between the source line and the source electrode to prevent such erroneous writing (see, e.g., Japanese Patent Publication No. H05-205487).

On the other hand, Japanese Patent Publication No. 2000-340759 proposes a NAND-type nonvolatile memory in which a gate electrode is provided on both surfaces of the semiconductor film, each memory cell is formed by a dual-gate transistor having a ferroelectric film connected to one of the gate portions, and the memory cells are connected in series as in flash memories.

FIG. 27 is a cross-sectional view showing a configuration of the memory cell described in Japanese Patent Publication No. 2000-340759. In a dual-gate transistor 100 forming a memory cell, a first gate electrode 105 is provided on one surface of a semiconductor film (a polycrystalline silicon film) 101 with both an insulating film 102 and a ferroelectric film 103 interposed therebetween, and a second gate electrode 106 is provided on the other surface of the semiconductor film 101 with an insulating film 104 interposed therebetween so that the second gate electrode 106 faces the first gate electrode 105. Source/drain regions (N-type silicon) $101b$, $101b$ having an opposite conductivity type to a channel region (P-type silicon) $101a$ of the semiconductor film 101 are formed at both ends of the second gate electrode 106, respectively.

SUMMARY

The dual-gate transistor of the memory cell described in Japanese Patent Publication No. 2000-340759 is switched by changing the voltage that is applied to the second electrode. However, since a silicon film is used as the semiconductor film, conduction of the transistor is carried out by forming an inversion layer in the semiconductor film. Thus, if the semiconductor film is thin, a depletion layer spreads over the entire thickness of the semiconductor film, and thus the channel resistance of the transistor is controlled only by the voltage that is applied to the second gate electrode, regardless of the polarization state of the ferroelectric film. In other words, the channel resistance of the transistor cannot be independently controlled by the polarization state (data written in the memory element) of the ferroelectric film and the voltage (a write voltage or a read voltage to the memory element) that is applied to the second gate electrode. Thus, data written in the non-selected memory cells is affected in the write or read operation.

The channel resistance can be independently controlled if the semiconductor film is made thicker than the depletion layer. However, increasing the thickness of the semiconductor film reduces the quality of the semiconductor film, thereby bringing new problems such as reducing reliability and making it difficult to form the source/drain regions by ion implantation.

Moreover, since the silicon film is used as the semiconductor film, an insulating film (a reaction suppressing layer) such as a silicon oxide film need be formed between the semiconductor film and the ferroelectric film in order to suppress the reaction between the semiconductor film and the ferroelectric film. However, if such a reaction suppressing layer may generate an electric field that weakens the polarization of the ferroelectric film when holding the data, thereby degrading retention characteristics of the data accumulated in the ferroelectric film.

In addition, since the silicon film is used as the semiconductor film, the source/drain regions need be formed so as to have a P/N junction with the channel region. This requires an additional step such as ion implantation.

The present invention was developed in view of the above problems, and it is a primary object of the present invention to provide a semiconductor memory cell that is formed by a dual-gate transistor capable of independently controlling channel resistance by data written in a memory element and an operating voltage of a select switching element.

A semiconductor memory cell according to the present invention includes: a memory element formed by a first field effect transistor having a gate insulating film made of a ferroelectric film; and a select switching element formed by a second field effect transistor having a gate insulating film made of a paraelectric film, wherein the ferroelectric film and the paraelectric film are stacked together with a semiconductor film of a compound semiconductor interposed therebetween, a first gate electrode of the first field effect transistor is formed on a side of the ferroelectric film, a second gate electrode of the second field effect transistor is formed on a side of the paraelectric film so as to face the first gate electrode, and the semiconductor film forms a common channel layer of the first and second field effect transistors.

With the above configuration, resistance of the semiconductor film that forms the common channel layer of the first and second field effect transistors can be independently controlled by a polarization state of the ferroelectric film (data written in the memory element) and a voltage that is applied to the second gate electrode (an operating voltage of the select switching element). Thus, in a NAND-type semiconductor memory device having multiple ones of the semiconductor memory cells of the present invention connected in series, read operation and write operation can be performed by simple control.

Since the compound semiconductor film is used as the semiconductor film, carriers in the semiconductor film can be generated by forming an accumulation layer. Thus, the channel region need not be formed with a different conductivity type from the source/drain regions, whereby a semiconductor film of the same conductivity type can be used as the semiconductor film. This facilitates manufacturing of the semiconductor memory cell.

Since the carriers in the semiconductor film can be only electrons or holes, a voltage range in which the transistor is off can be increased. This enables the transistor to be turned on/off according to the polarization direction of the ferroelectric material.

In addition, due to low reactivity between the compound semiconductor film and the ferroelectric film, no insulating film such as a silicon oxide film need be formed between the semiconductor film and the ferroelectric film. This allows the semiconductor film to be formed directly on the ferroelectric film, thereby reducing degradation of retention characteristics of data accumulated in the ferroelectric film.

According to the present invention, the channel resistance of the dual-gate transistor of the semiconductor memory cell can be independently controlled by the polarization state of the ferroelectric film of the first field effect transistor and the voltage that is applied to the second gate electrode of the second field effect transistor. Thus, in the NAND-type semiconductor memory device having the semiconductor memory cells connected in series, write operation and read operation can be performed by simple control.

BRIEF DESCRIPTION OF THE DRAWINGS

FIG. 6A is a diagram illustrating write operation of the memory cell in the first embodiment of the present invention, and FIG. 6B is a diagram illustrating read operation of the memory cell, and FIG. 6C is a diagram showing a read current of the memory cell.

DETAILED DESCRIPTION

Embodiments of the present invention will be described below with reference to the accompanying drawings. Note that the present invention is not limited to the following embodiments. The embodiments can be modified as appropriate without departing from the spirit and scope of the invention, and may be combined with other embodiments.

(First Embodiment)

Figure 1A:
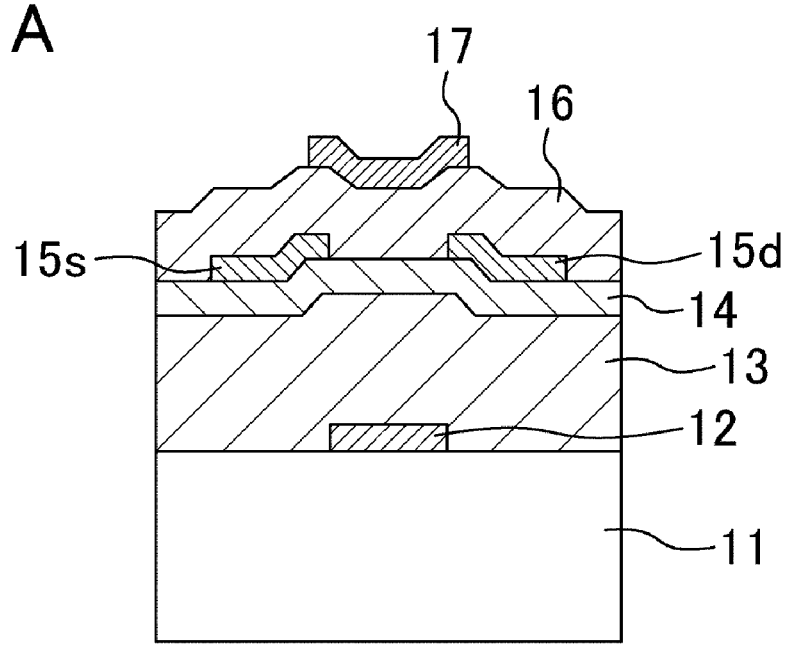
FIG. 1A is a diagram showing a configuration of a semiconductor memory cell according to a first embodiment of the present invention.
Figure 1B:
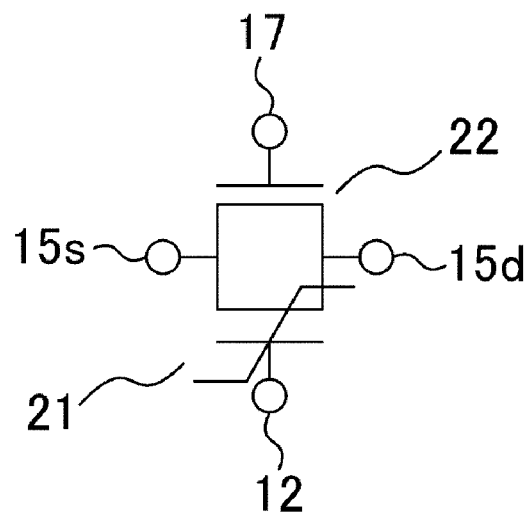
FIG. 1B is an equivalent circuit diagram thereof.

FIGS. 1A-1B are diagrams schematically showing a configuration of a semiconductor memory cell in a first embodiment of the present invention, where FIG. 1A is a cross-sectional view of the semiconductor memory cell, and FIG. 1B is an equivalent circuit diagram thereof.

As shown in FIG. 1A, a ferroelectric film 13 and a paraelectric film 16 are stacked together over a substrate 11 with a semiconductor film 14 interposed between the ferroelectric film 13 and the paraelectric film 16. A first gate electrode 12 of a first field effect transistor (FET) is formed on the side of the ferroelectric film 13, and a second gate electrode 17 of a second FET is formed on the side of the paraelectric film 16 so as to face the first gate electrode 12. The semiconductor film 14 is made of a compound semiconductor that forms a common channel layer of the first and second FETs, and a common source electrode 15s and a common drain electrode 15d of the first and second FETs are formed on the semiconductor film 14.

That is, as shown in FIG. 1A, the semiconductor memory cell of the present embodiment is structured by stacking a bottom gate-type MFSFET (a memory element) and a top gate-type MISFET (a select switching element). In an equivalent circuit, as shown in FIG. 1B, the semiconductor memory cell is configured so that an MFSFET 21 and an MISFET 22 are connected in parallel.

Write operation to the memory element is performed by applying a predetermined voltage between the first gate electrode 12 and the source and drain electrodes 15s, 15d to generate an electric field in the ferroelectric film 13, and thus changing the polarization state of the ferroelectric film 13.

Figures 2, 3:
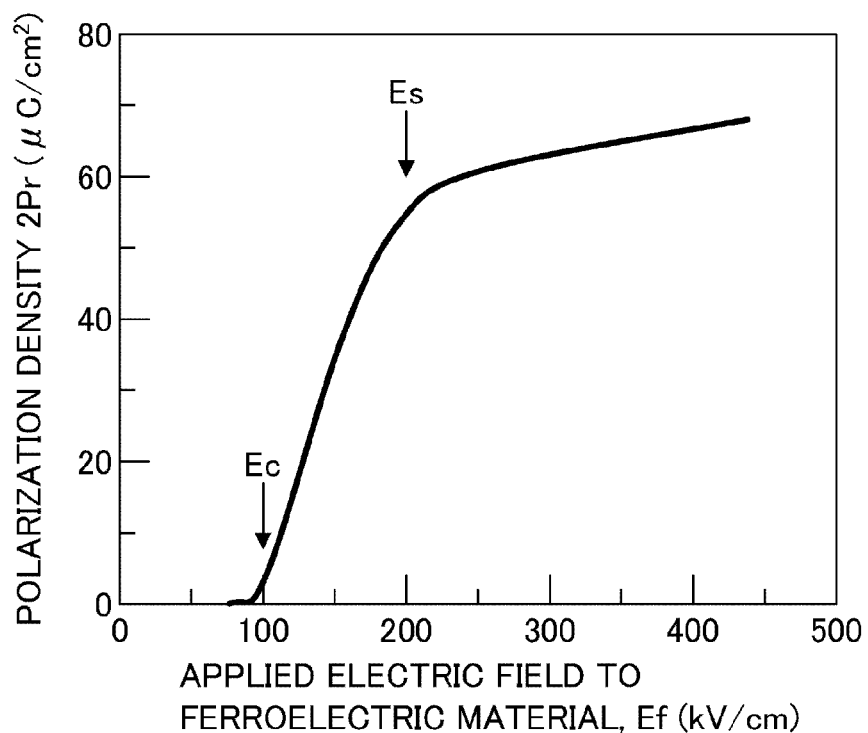
FIG. 2 is a table showing a read current of the semiconductor memory cell of the first embodiment of the present invention.
FIG. 3 is a graph showing polarization characteristics of a ferroelectric film in the first embodiment of the present invention.

Read operation from the memory element is performed by applying a predetermined voltage between the source electrode 15s and the drain electrode 15d and detecting a current flowing the channel layer (the semiconductor film 14). Since the memory element (MFSFET) 21 and the select switching element (MISFET) 22 form a parallel circuit, the read current changes as shown in FIG. 2, depending on the data written in the memory element 21 and the on/off state of the select switching element 22. That is, a large current value is obtained if either the MFSFET 21 or the MISFET 22 is on. Thus, the data written in the memory element 21 can be determined by measuring the current value obtained when the MISFET 22 is off.

With this configuration, the resistance of the semiconductor film 14 that forms the common channel layer of the MFSFET 21 and the MISFET 22 can be independently controlled by the polarization state (the data written in the memory element) of the ferroelectric film 13 and the voltage that is applied to the second gate electrode 17. Thus, in the case where this configuration is applied to a NAND-type semiconductor memory device having the semiconductor memory cells of the present embodiment connected in series, write operation and read operation can be performed by simple control.

Since the compound semiconductor film is used as the semiconductor film 14, carriers in the semiconductor film 14 can be generated by forming an accumulation layer. Thus, the channel region need not be formed with a different conductivity type from the source/drain regions, whereby a semiconductor film of the same conductivity type can be used as the semiconductor film 14. This facilitates manufacturing of the semiconductor memory cell.

Since the carriers in the semiconductor layer 14 can be only electrons or holes, a voltage range in which the transistor is off can be increased. This enables the transistor to be turned on/off according to the polarization direction of the ferroelectric material.

If both electrons and holes are present as the carriers, the electrons and the holes are induced according to the polarization axis of the ferroelectric material. That is, electrons are induced at the interface if the polarization axis faces the side of the semiconductor film 14, and holes are induced at the interface if the polarization axis faces the opposite side. Thus, the semiconductor film 14 is brought into a low resistance state regardless of the direction of the polarization axis. In order for the transistor to be off in this state, it is necessary to form the source/drain regions having a P/N junction with the channel region, or to create a state where the polarization is zero. However, in the former case, the structure becomes complex, and in the latter case, it is difficult to stably create the state where the polarization is zero. It is therefore useful to use either electrons or holes as the carriers in order to turn on/off the transistor according to only the direction of the polarization axis.

Moreover, due to low reactivity between the compound semiconductor film 14 and the ferroelectric film 13, no insulating film such as a silicon oxide film need be formed between the semiconductor film 14 and the ferroelectric film 13. This allows the semiconductor film 14 to be formed directly on the ferroelectric film 13, thereby reducing degradation of retention characteristics of data accumulated in the ferroelectric film 13.

As a specific configuration of the semiconductor memory cell in the present embodiment, strontium titanate ($StTiO_3$, hereinafter referred to as "STO"), etc. can be used as the substrate 11, lead zirconate titanate ($Pb(Zr, Ti)O_3$, hereinafter referred to as "PZT"), etc. can be used as the ferroelectric film 13, zinc oxide (ZnO), etc. can be used as the semiconductor film 14, and silicon nitride (SiN), etc. can be used as the paraelectric film 16. The ZnO film has a wide bandgap, and typically exhibits N-type conductivity in which only electrons are present as carriers. Accordingly, when the transistor is turned on, electrons are induced as carriers, resulting in a low resistance state. When the transistor is turned off, holes are less likely to be induced even after the electrons are discharged. Thus, a high-resistance state can be stably implemented.

FIG. 3 is a graph showing polarization characteristics of the PZT film. In this example, upper and lower electrodes, which are respectively made of strontium ruthenate ($StRuO_3$, hereinafter referred to as "SRO") and titanium (Ti), were formed on both surfaces of the PZT film (thickness: 300 nm), respectively, and the residue polarization density 2Pr was plotted for various electric fields Ef applied to the PZT film.

When the electric field applied between the upper and lower electrodes is 100 kV/cm (Ec in FIG. 3: a coercive electric field, corresponding to 3V) or less, 2Pr is approximately zero. When the applied electric field exceeds Ec, polarization reversal suddenly occurs, and 2Pr increases. 2Pr is saturated at the electric field of 200 kV/cm (Es in FIG. 3, corresponding to 6V) or more. In the present embodiment, the applied electric field was set to ±333 kV/cm (corresponding to ±10V) in order to reverse the polarization of the ferroelectric film 13, so that sufficiently saturated 2Pr can be obtained. 2Pr obtained by this electric field is 59 µC/cm².

Then, a ZnO film (thickness: 30 nm) as the semiconductor film 14 was formed on the PZT film. The carrier concentration of the ZnO film obtained by hole measurement was $8\times10^{17}$ cm$^{-3}$. According to the thickness of the ZnO film, the carrier density per unit area was $2.4\times10^{12}$ cm$^{-2}$. The charge density obtained by multiplying the carrier density per unit area by elementary electric charge of $1.6\times10^{-19}$ C was 0.4 µC/cm², which is lower than the polarization charge density of the PZT. Thus, when a negative voltage is applied to the first gate electrode 12 of the MFSFET, the polarization of the ferroelectric film 13 was oriented downward to repel carriers away, so that the whole semiconductor film 14 (the entire channel layer) on the first gate electrode 12 was depleted. On the other hand, when a positive voltage is applied to the first gate electrode 12, the polarization of the ferroelectric film 13 was oriented upward to induce carriers at the interface at a density corresponding to the polarization density. In this manner, the two states, namely the presence and absence of charge at the interface between the ferroelectric film 13 and the semiconductor film 14 (the channel layer), can be implemented depending on the voltage to be applied to the first gate electrode 12. The electrical conductivity at the interface significantly varies between these two states.

Figure 4A:
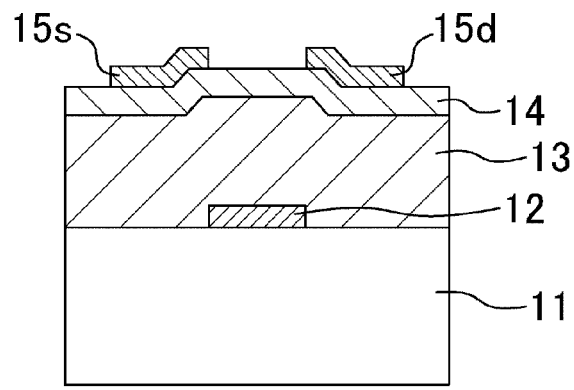
FIG. 4A is a cross-sectional view showing a configuration of an MFSFET in the first embodiment the present invention.
Figure 4B:
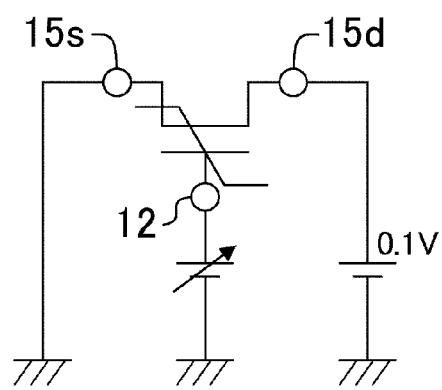
FIG. 4B is diagram illustrating a method of measuring switching characteristics of the MFSFET.
Figure 4C:
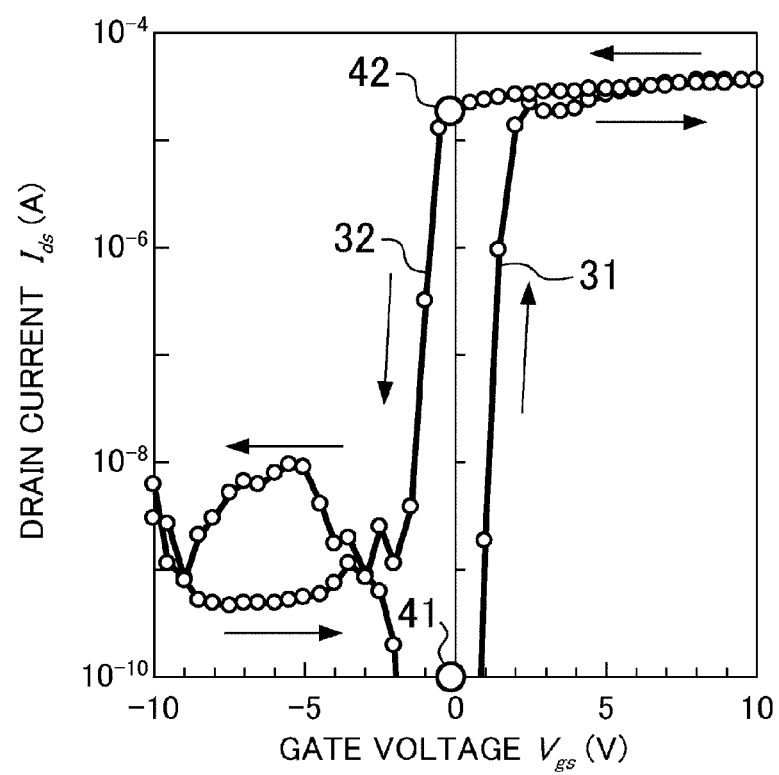
FIG. 4C is a graph showing the switching characteristics of the MFSFET.

In order to verify this, MFSFETs having the structure shown in FIG. 4A were produced, and switching characteristics of the MFSFETs were examined by sweeping the voltage of the gate electrode 12 with the source electrode 15s being grounded and a voltage of 0.1 V being applied to the drain electrode 15d, as shown in FIG. 4B. FIG. 4C is a graph plotting the drain current $I_{ds}$ (31 in the figure) obtained when the gate voltage $V_{gs}$ was swept from −10 V to +10 V, and the drain current $I_{ds}$ (32 in the figure) obtained when the gate voltage $V_{gs}$ was swept from +10 V to −10 V.

Hysteresis was observed in the drain current $I_{ds}$, and the drain current flowing at the gate voltage of 0 V when sweeping the gate voltage of the gate electrode 12 from a negative voltage is as low as 100 pA or less, and the drain current flowing at the gate voltage of 0V when sweeping the gate voltage from a positive voltage is as high as 10 µA. This is because the channel layer 14 is depleted to have a high resistance upon application of a negative voltage, and the channel layer 14 is brought into a charge accumulating state to have a low resistance upon application of a positive voltage, as described above.

The state 42 where the drain current is large at the gate electrode of 0V and the state 41 where the drain current is small at the gate voltage of 0 V are associated with binary data "1" and "0," respectively, whereby the MFSFET functions as the memory element. Moreover, even if the voltage is cut off, the residue polarization of the ferroelectric film 13 is stored, and the state where charge is accumulated is maintained. It has been verified from the actual drain current measured after leaving the MFSFET of the present embodiment at room temperature for 24 hours that a five-figure drain current ratio is maintained.

Figure 5A:
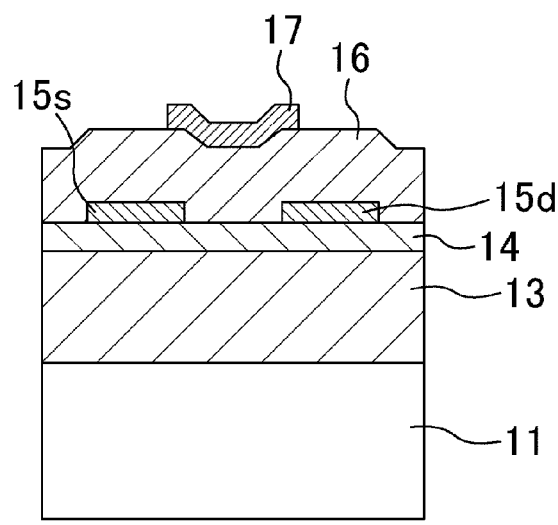
FIG. 5A is a cross-sectional view showing a configuration of an MISFET in the first embodiment the present invention.
Figure 5B:
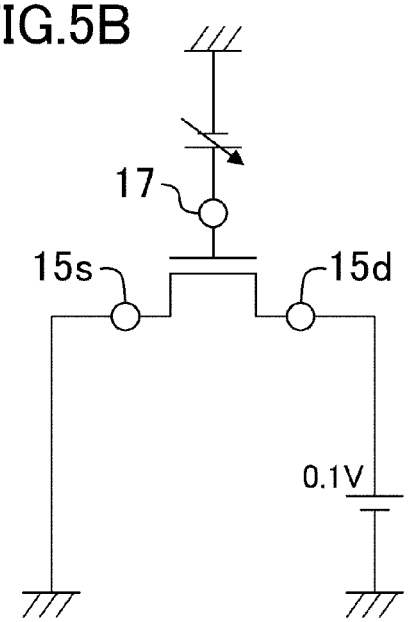
FIG. 5B is diagram illustrating a method of measuring switching characteristics of the MISFET.
Figure 5C:
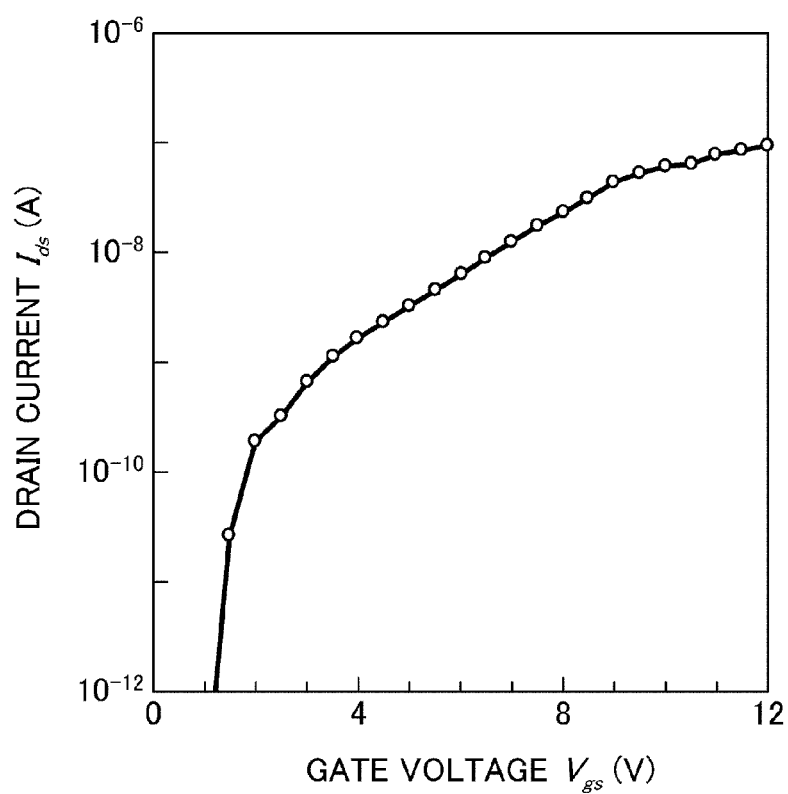
FIG. 5C is a graph showing the switching characteristics of the MISFET.

In order to verify the operation of the MISFET, MISFETs having the structure shown in FIG. 5A were produced, and switching characteristics of the MISFETs were examined by sweeping the voltage of the gate electrode 17 with the source electrode 15s being grounded and a voltage of 0.1 V being applied to the drain electrode 15d, as shown in FIG. 5B. FIG. 5C is a graph plotting the drain current $I_{ds}$ obtained when the gate voltage $V_{gs}$ was swept from −10 V to +10 V. The resistance is low when a positive voltage was applied, and the resistance is high when no voltage is applied.

Write operation and read operation of the semiconductor memory cell formed by the dual-gate transistor having the structure of FIG. 1A were verified.

In the write operation, as shown in FIG. 6A, the second gate electrode 17, the source electrode 15s, and the drain electrode 15d were grounded, and a voltage was applied to the first gate electrode 12. The electric field that is applied to the ferroelectric film 13 changes according to the applied voltage, and resistance of the semiconductor film 14 changes accordingly. When a positive voltage is applied, the polarization of the ferroelectric film 13 is oriented upward, and electrons are accumulated at the interface between the semiconductor film 14 and the ferroelectric film 13, whereby the semiconductor film 14 has a low resistance. On the other hand, when a negative voltage is applied, the polarization of the semiconductor film 14 is oriented downward, and electrons are discharged, whereby the semiconductor film 14 has a high resistance. In this example, +10 V was used to write the on state, and −10 V was used to write the off state.

In the read operation, as shown in FIG. 6B, the first gate electrode 12 and the source electrode 15s were grounded, a voltage of 0.1 V was applied to the drain electrode 15d while applying a voltage to the second gate electrode 17, and a current flowing between the source electrode 15s and the drain electrode 15d was measured.

The result of the read current is shown in FIG. 6C. When the MFSFET was on, a current of about $10^{-6}$ A flowed regardless of the state of the MISFET. Similarly, when the MISFET was on, a current of about $10^{-7}$ A flowed regardless of the state of the MFSFET. The result also shows that a current is $10^{-9}$ A or less only when both the MFSFET and the MISFET are off. That is, almost no current flows in this case.

According to this result, the semiconductor memory cell of the present embodiment has the four states as shown in FIGS. 7A-7D depending on the on/off state of the MFSFET and the MISFET.

Figure 7A:
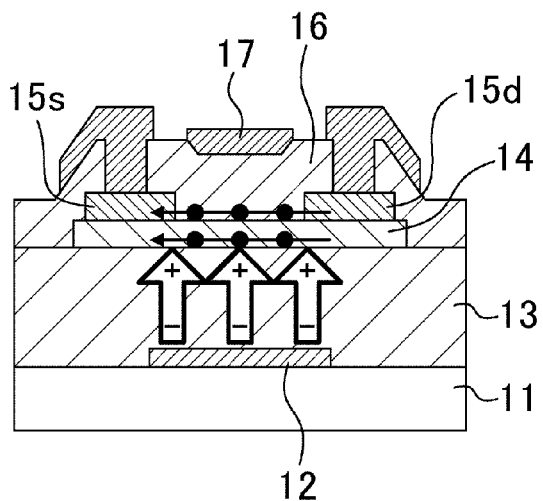
FIGS. 7A-7D are diagrams showing each state of the memory cell in the first embodiment of the present invention.
Figure 7B:
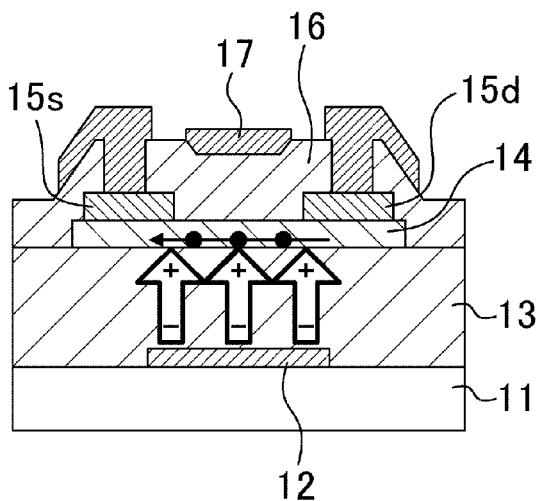
Figure 7C:
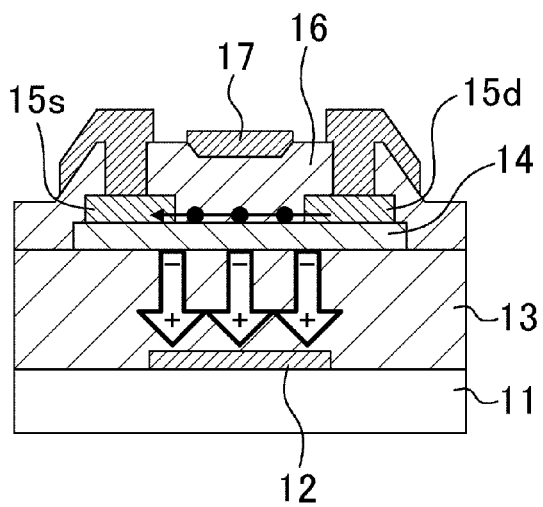
Figure 7D:
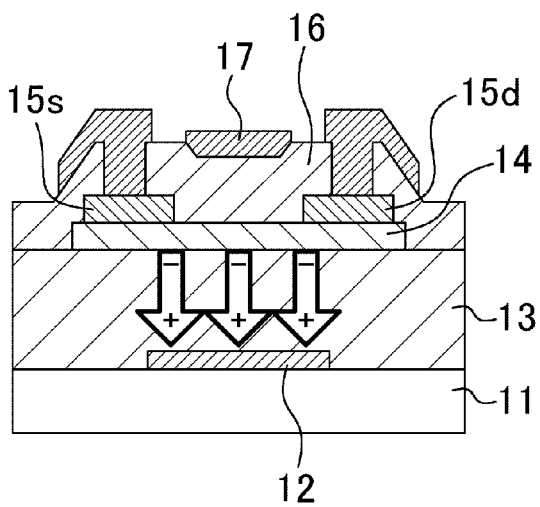

As shown in FIG. 7A, when both the MFSFET and the MISFET are on, both the upper and lower surfaces of the semiconductor film 14 have a low resistance, and a current flows along both the upper and lower surfaces of the semiconductor film 14, whereby a large current flows in the semiconductor film 14. As shown in FIG. 7B, when the MFSFET is on and the MISFET is off, only the lower surface of the semiconductor film 14 has a low resistance, and a current flows along the lower surface of the semiconductor film 14, whereby a current flows in the semiconductor film 14. As shown in FIG. 7C, when the MFSFET is off and the MISFET is on, only the upper surface of the semiconductor film 14 has a low resistance, and a current flows along the upper surface of the semiconductor film 14, whereby a large current flows in the semiconductor film 14. As shown in FIG. 7D, when both the MFSFET and the MISFET are off, both the upper and lower surfaces of the semiconductor film 14 have a high resistance, and no current flows in the semiconductor film 14.

Thus, the current flowing in the semiconductor film 14 (the channel layer) changes according to the on/off state of the MFSFET and the MISFET, and no current flows when both the MFSFET and the MISFET are off. Accordingly, it can be said that this operation implements the operation of the semiconductor memory cell shown in FIG. 2.

An example of a semiconductor memory device configured by arranging a plurality of semiconductor memory cells 50 of the present embodiment will be described below.

Figure 8A:
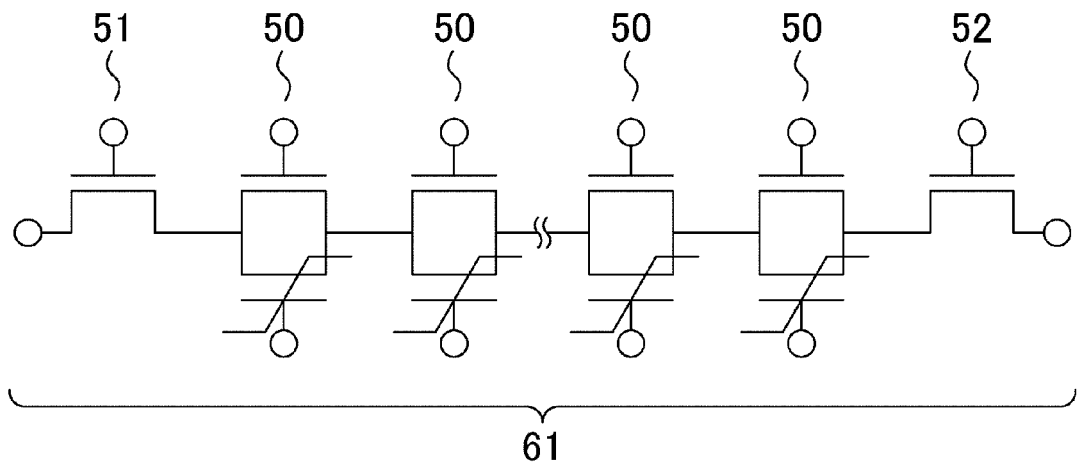
FIG. 8A is a diagram showing a configuration of a memory block in the first embodiment of the present invention.
Figure 8B:
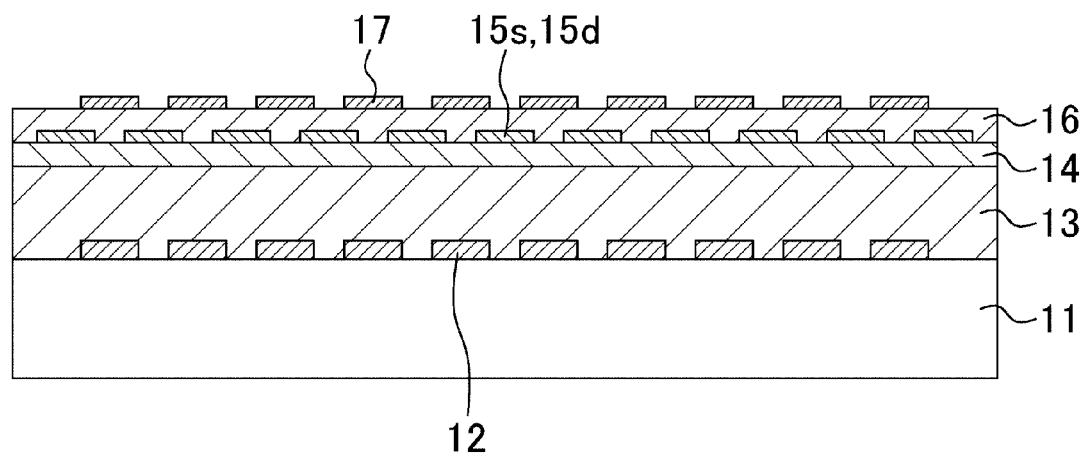
FIG. 8B is a cross-sectional view thereof.
Figure 9:
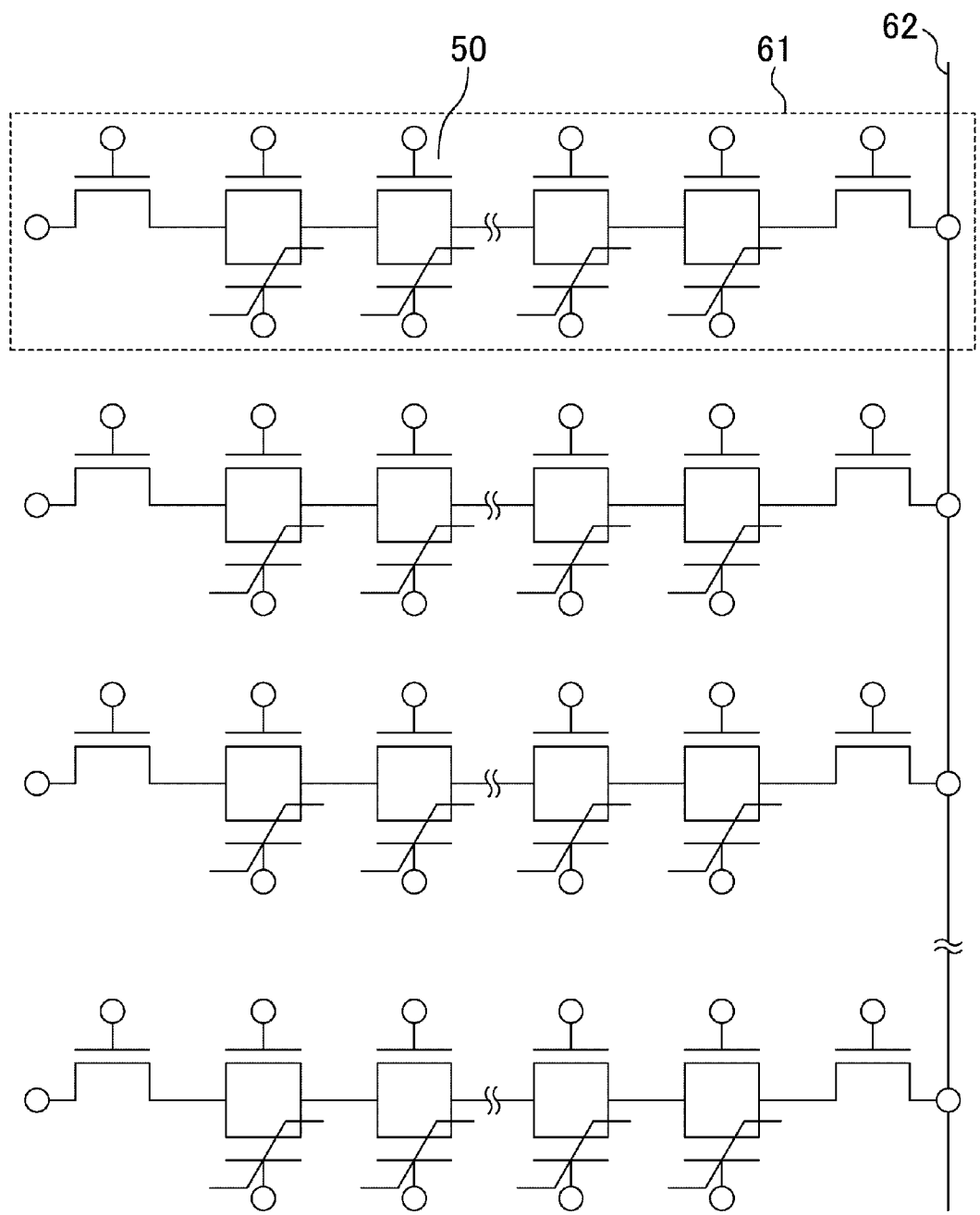
FIG. 9 is a diagram showing a configuration of a semiconductor memory device in the first embodiment of the present invention.

FIG. 8A is a diagram showing a configuration of a memory block 61 of a semiconductor memory device in which a plurality of semiconductor memory cells 50 are connected in series and select transistors 51, 52 are respectively provided at both ends of the series connection of the semiconductor memory cells 50, and FIG. 8B is a cross-sectional view thereof. FIG. 9 is a diagram showing a configuration of a semiconductor memory device having a memory array configuration in which a plurality of memory blocks 61 are arranged, a word line is provided at one end of the memory blocks 61, and a source line 62 is provided at the other end of the memory blocks 61.

Figure 10A:
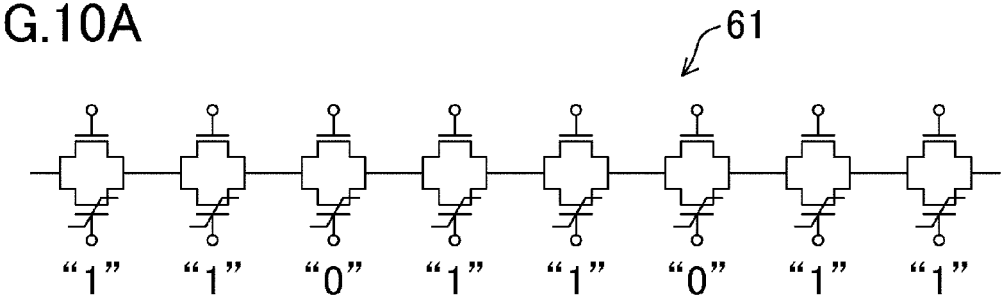
FIG. 10A is a diagram illustrating a method of writing the memory block in the first embodiment of the present invention.

Operation of the memory block 61 in the present embodiment will be described below with reference to FIG. 10.

In write operation, all the MISFETs are first turned on. Next, a predetermined voltage is applied to the first gate electrodes according to data to be written, and the data is written to each memory cell. For example, in order to write "0" of binary data, a negative voltage is applied between the first gate electrode and the source/drain electrodes so that the polarization of the ferroelectric film in the memory cell is oriented downward to repel electrons away, thereby bringing the MFSFET into a high resistance state. On the other hand, in order to write data "1," a positive voltage is applied between the first gate electrode and the source/drain electrodes so that the polarization of the ferroelectric film in the memory cell is oriented upward to accumulate electrons, thereby bringing the MFSFET into a low resistance state.

Note that all the MISFETs are turned on in the above write operation. However, even if the MISFETs are off, similar write operation can be implemented as long as the potential is the same at both ends of the block.

In read operation, only the MISFET of the memory cell to be read is turned off, and the MISFETs of the other memory cells are turned on. In this state, the source line is grounded, and a predetermined voltage is applied to the word line to read a current flowing in the memory block 61. At this time, since the MISFETs of the memory cells that are not to be read are on, these memory cells have a low channel resistance regardless of the state of the MFSFETs. On the other hand, since the MISFET of the memory cell to be read is off, the channel resistance of this memory cell varies according to the data (the polarization state of the ferroelectric film of the MFSFET) written in the MFSFET.

Figure 10B:
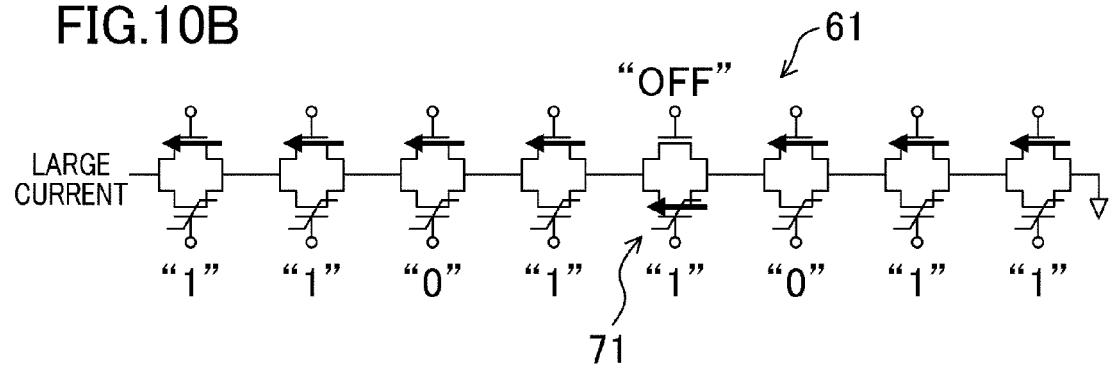
FIGS. 10B-10C are diagrams showing a method of reading the memory block.
Figure 10C:
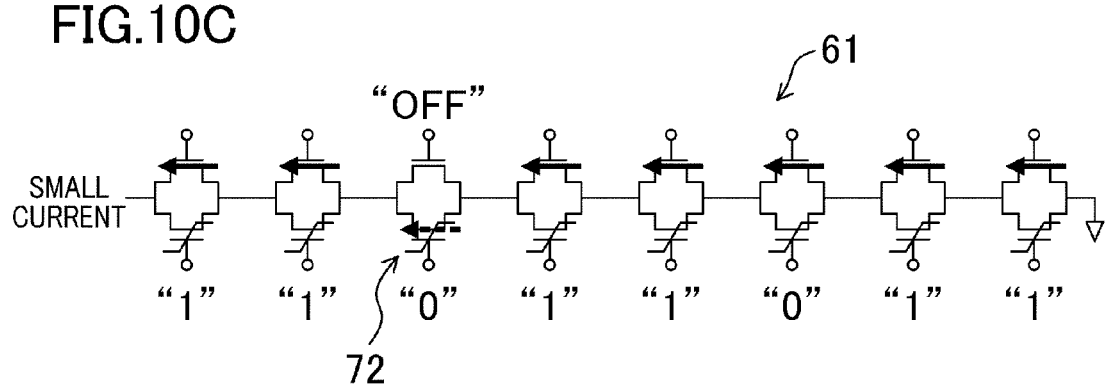

That is, in the memory block 61 in which the memory cells are connected in series, the current value flowing in the memory block 61 varies according to the data of the memory cell to be read. For example, as shown in FIG. 10B, if data "1" has been written in a memory cell 71 to be read, the memory cell 71 has a low channel resistance, and thus the current flowing in the memory block 61 is increased. On the other hand, as shown in FIG. 10C, if data "0" has been written in a memory cell 72 to be read, the memory cell 71 has a high channel resistance, and thus the current flowing in the memory block 61 is reduced. Accordingly, the data written in the memory cell can be determined by the magnitude of the current value flowing in the memory block 61 (or the resistance value of the memory block 61).

In the semiconductor memory cell of the present embodiment, the channel resistance of the semiconductor film can be independently controlled by the polarization state (the data written to the MFSFET) of the ferroelectric film and the voltage that is applied to the second gate electrode (the on/off state of the MISFET). Thus, in order to read the data from each memory of the memory block, only the MISFET of the memory cell to be read is turned off (the MISFETs of the other memory cells are turned on), whereby the data can be easily read from the memory cell. Thus, when the semiconductor memory cell of the present embodiment is applied to a NAND-type semiconductor memory device, write operation and read operation can be performed by simple control.

As described above, data written in the memory cell is determined according to the magnitude of the current value flowing in the memory block 61. However, the current value flowing in the memory block 61 is regulated by higher one of the current value of the MISFET in an on state and the current value flowing in the MFSFET having data "1" written therein. Thus, in order to increase the read accuracy of the memory cell, it is preferable to make the current value flowing in the MISFET in an on state substantially the same as the current value flowing in the MFSFET having data "1" written therein. In other words, it is preferable to make the capacitance of the ferroelectric film substantially the same as that of the paraelectric film. The "capacitance of the ferroelectric film" refers to the capacitance corresponding to the charge induced when a voltage of 0 V is applied to the ferroelectric film. Such capacitance can be measured by, e.g., measuring the amount of polarization of the ferroelectric material.

Figure 11:
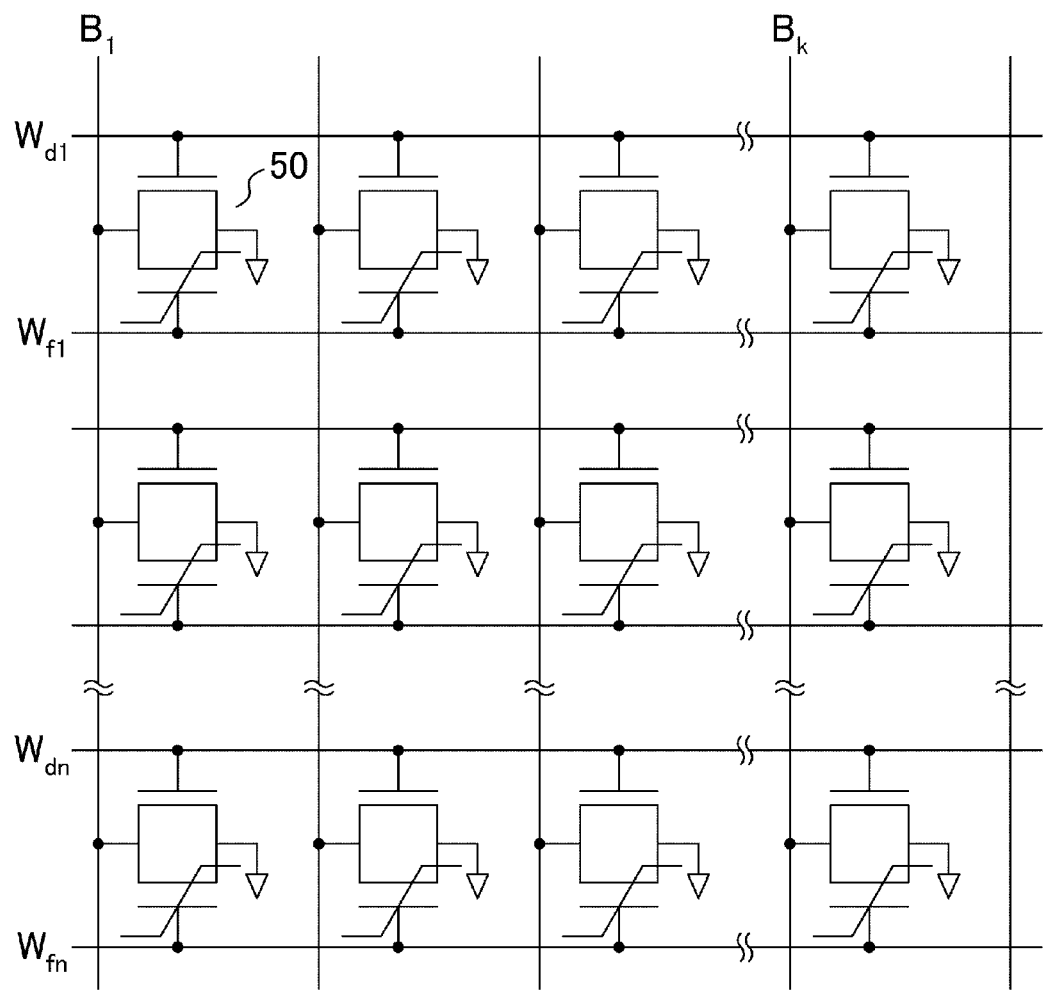
FIG. 11 is a diagram showing a configuration of a semiconductor memory device in a modification of the first embodiment.

The semiconductor memory cell of the present embodiment is also applicable to such a matrix-type semiconductor memory device as shown in FIG. 11, in addition to the NAND-type semiconductor memory device.

An example of writing data "1" to a memory cell 50 will be described with reference to FIG. 11. A source line (not shown) is grounded, and a negative voltage is applied to a word line $W_{d1}$ to turn off the MISFET of the memory cell 50. Then, a bit line $B_1$ is grounded, and a positive voltage pulse (e.g., 10 V, 100 ns) is applied to a word line $W_{f1}$. Thus, in the MFSFET of the memory cell 50, the polarization of the ferroelectric film is oriented toward the semiconductor film, whereby the channel layer is in an accumulating state with a low resistance. At this time, a positive voltage is applied to the other non-selected bit lines $B_k$, and the polarization state does not change. The word lines $W_{dn}$, $W_{fn}$ of the other memory cells connected to the selected bit line $B_1$ are also grounded, and data "1" is written only to the arbitrary memory cell 50. Thus, random access to the memory cell 50 can be implemented.

A manufacturing method of the semiconductor memory cell of the present embodiment will be described below with reference to FIGS. 12A-12D.

Figure 12A:
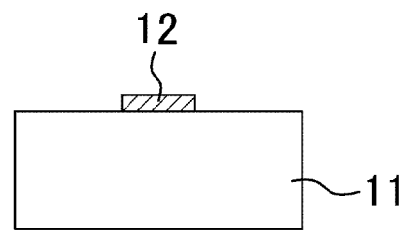
FIGS. 12A-12D are diagrams illustrating a manufacturing method of the semiconductor memory cell in the first embodiment of the present invention.
Figure 12B:
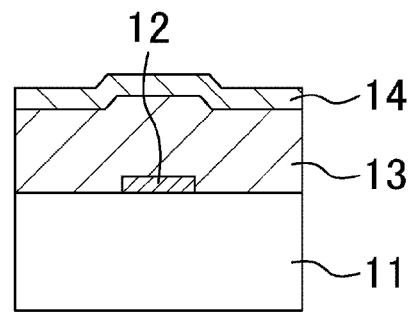

First, as shown in FIG. 12A, an SRO film having a thickness of 30 nm is formed on a substrate 11 made of monocrystalline strontium titanate ($SrTiO_3$, hereinafter referred to as "STO") at a substrate temperature of 700° C. by a pulsed laser deposition (PLD) method. Then, a resist is applied and patterned thereon, and the SRO film is etched by an ion milling method to form a first gate electrode 12.

Thereafter, a gate insulating film 13 made of a ferroelectric film, PZT, is formed with a thickness of 450 nm over the substrate 11 at a substrate temperature of 700° C. so as to cover the gate electrode 12. At this time, a sintered compact used as a target has a composition of Pb:Zr:Ti=1:0.52:0.48. In this composition, a lattice mismatch between the STO substrate 11 and the SRO and PZT films is within 3%, and the SRO film and the PZT film can be epitaxially grown on the STO substrate 11 under the above growth conditions. The surface of the PZT film formed by this method was very smooth with root mean square roughness of 3 nm or less, as observed by an atomic force microscope (AFM). Then, a semiconductor film 14 made of ZnO is formed with a thickness of about 30 nm at a substrate temperature of 400° C. in the same chamber of a PLD apparatus.

Figure 12C:
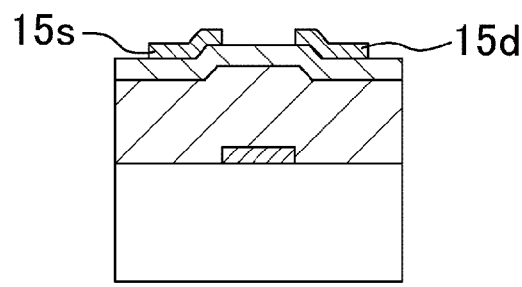

Subsequently, as shown in FIG. 12C, a patterned resist film (not shown) is formed on the semiconductor film 14, a titanium (Ti) film having a thickness of 20 nm and a platinum (Pt) film having a thickness of 30 nm are formed by an electron beam deposition method, and source/drain electrodes 15s, 15d are formed at predetermined positions by an etchback method.

Figure 12D:
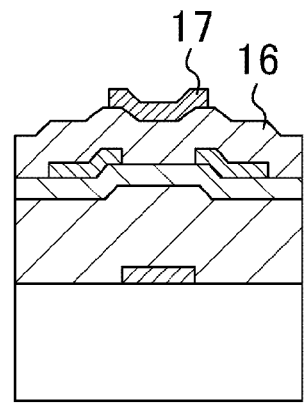

Then, as shown in FIG. 12D, a gate insulating film 16 made of a paraelectric film, SiN, is formed by a sputtering method. A patterned resist film (not shown) is formed thereon, a Ti film having a thickness of 20 nm and a Pt film having a thickness of 50 nm are formed by an electron beam deposition method, and a second gate electrode 17 is formed at a predetermined position by an etchback method. The semiconductor memory cell shown in FIG. 1A is manufactured in this manner.

(Second Embodiment)

In the NAND-type nonvolatile memory described in Patent Document 2, data written to a selected memory cell is read by turning off only the MISFET of this memory cell and turning on the other MISFETs, and measuring a current flowing in a memory block where the memory cells are connected in series.

Since FETs having a gate insulating film of a paraelectric material are used as the MISFETs of these memory cells, these MISFETs are also used for select transistors of the memory block. Thus, these MISFETs are usually of a normally-off type. When reading the nonvolatile memory using the normally-off type transistors, a voltage is applied to the gate electrodes in order to turn on the MISFETs of the non-selected memory cells. As a result, the polarization state of the ferroelectric film of the non-selected memory cells is reversed, which may disturb the data written in the memory cell.

When reading the nonvolatile memory, a predetermined voltage need be applied to the gate electrodes in order to turn on all the second FETs of the non-selected memory cells. This increases power consumption.

A semiconductor memory device causing less disturbance and having low power consumption will be described in the second embodiment of the present invention.

Figure 13A:
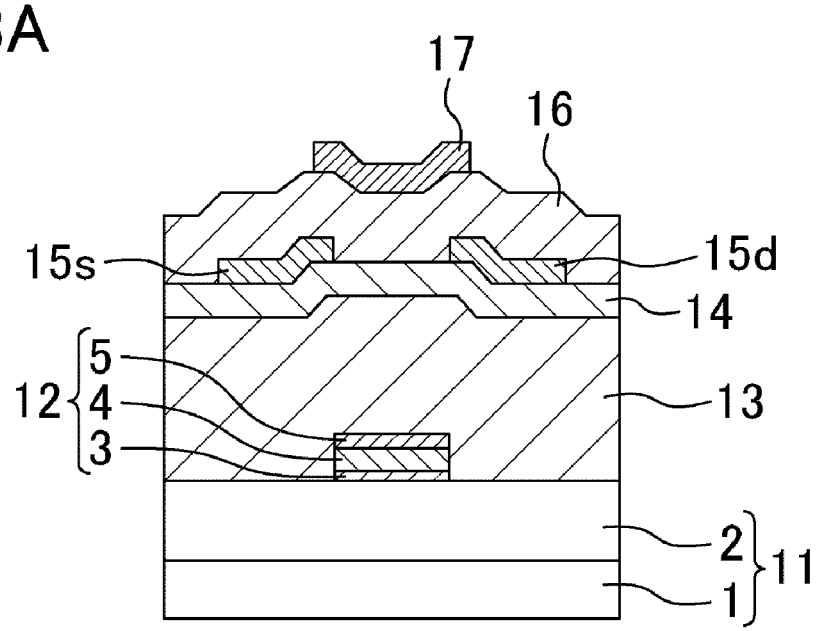
FIG. 13A is a diagram showing a configuration of a semiconductor memory cell in a second embodiment of the present invention.
Figure 13B:
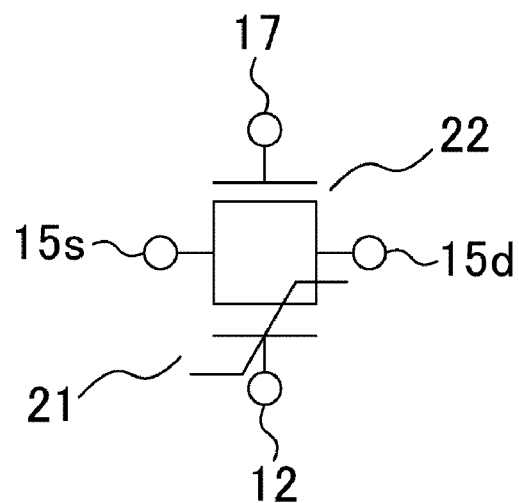
FIG. 13B is an equivalent circuit diagram thereof.

FIGS. 13A-13B are diagrams schematically showing a configuration of a semiconductor memory cell used in the semiconductor memory device of the second embodiment of the present invention, where FIG. 13A is a cross-sectional view of the semiconductor memory cell, and FIG. 13B is an equivalent circuit diagram thereof.

As shown in FIG. 13A, a ferroelectric film 13 and a paraelectric film 16 are stacked over a substrate 11 with a semiconductor film 14 interposed between the ferroelectric film 13 and the paraelectric film 16. A first gate electrode 12 of a first FET is formed on the side of the ferroelectric film 13, and a second gate electrode 17 of a second FET is formed on the side of the paraelectric film 16 so as to face the first gate electrode 12. The semiconductor film 14 is made of a compound semiconductor that forms a common channel layer of the first and second FETs. A common source electrode 15s and a common drain electrode 15d of the first and second FETs are formed on the semiconductor film 14.

Note that in the present embodiment, a silicon substrate 1 having a silicon oxide film 2 formed on its surface is used as the substrate 11, and a stacked film of a Ti film 3, a Pt film, and a $SrRuO_3$ (hereinafter referred to as "SRO") film 5 is used as the first gate electrode 12.

As shown in FIG. 13A, the semiconductor memory cell of the present embodiment has a stacked structure of a bottom gate MFSFET (a memory element) and a top gate MISFET (a select switching element). In an equivalent circuit, as shown in FIG. 13B, the semiconductor memory cell of the present embodiment is configured so that an MFSFET 21 and an MISFET 22 are connected in parallel.

Figure 14A:
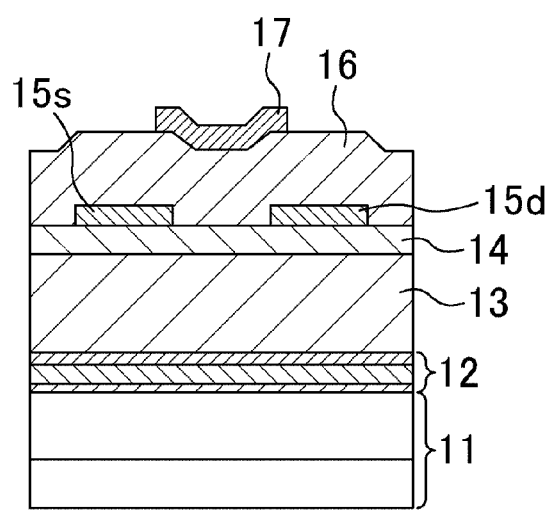
FIG. 14A is a cross-sectional view showing a configuration of an MISFET in the second embodiment of the present invention.
Figure 14B:
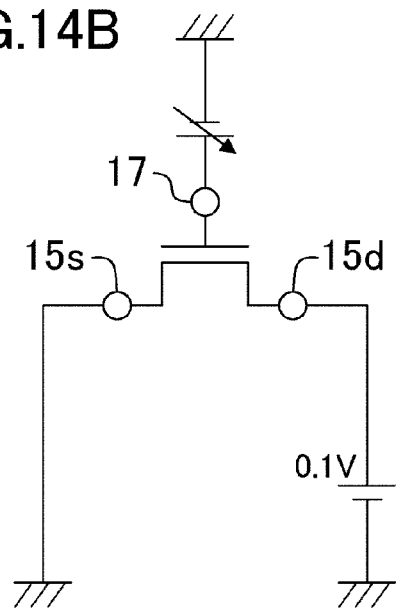
FIG. 14B is a diagram illustrating a method of measuring switching characteristics of the MISFET.
Figure 14C:
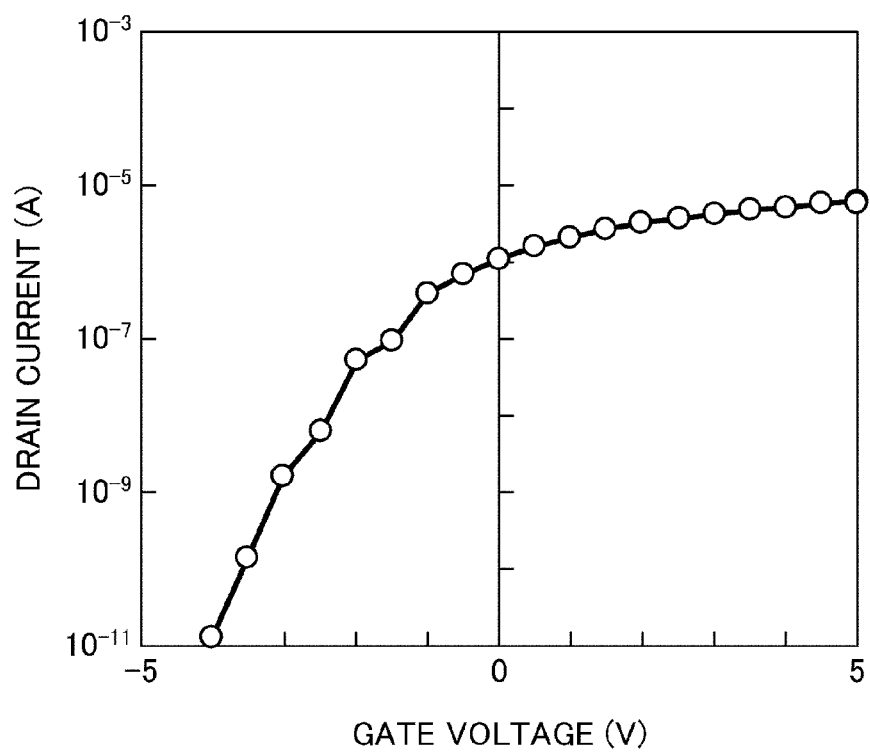
FIG. 14C is a graph showing the switching characteristics of the MISFET.

In order to verify the operation of the MISFET, an MISFET having a structure of FIG. 14A was produced, and switching characteristics of this MISFET were examined by sweeping the voltage of the gate electrode 17 while grounding the source electrode 15s and applying a voltage of 0.1 V to the drain electrode 15d, as shown in FIG. 14B. FIG. 14C is a graph plotting a drain current obtained by sweeping the gate voltage from −5 V to +5 V. The graph shows that the MISFET has a high resistance when a negative voltage is applied, and has a low resistance when no voltage is applied. That is, this MISFET is a normally-on type FET.

On the other hand, as shown in FIG. 5C, the MISFET of FIG. 5A has a low resistance when a positive voltage is applied, and has a high resistance when no voltage is applied. That is, this MISFET is a normally-off type FET.

The reason why the MISFET can be of the normally-on type or the normally-off type will be described below.

In the MISFET of FIG. 14A, the first gate electrode 12 is formed by a stacked film of the Ti film 3, the Pt film 4, and the SRO film 5 (see FIG. 13A). Thus, the ZnO film 14 as the semiconductor film is formed on the Pt film 4 with both the PZT film 13 and the SRO film 5 interposed therebetween. On the other hand, the ZnO film 14 of the MISFET in FIG. 5A is formed on the STO substrate 11 with the PZT film 13 interposed therebetween.

The ZnO film formed over the Pt film has a (0001) orientation. This is because the PZT film formed on the Pt film having a (111) orientation with the SRO film interposed therebetween tends to have the (111) orientation, and the ZnO film formed on the PZT film tends to have the (0001) orientation. On the other hand, the ZnO film formed over the STO film has a (11-20) orientation. This is because the PZT film formed on the STO film having a (001) orientation with the SRO film interposed therebetween tends to have the (001) orientation, and the ZnO film formed on the PZT film tends to have the (11-20) orientation.

Thus, since the ZnO film is a material having spontaneous polarization in a <0001> direction, the ZnO film formed over the SRO film induces charge at the interface with the gate insulating film 16 by the spontaneous polarization in the <0001> direction. Accordingly, the MISFET having the first gate electrode 12 made of the stacked film of Ti film/Pt film/SRO film is a normally-on type FET because charge is constantly induced at the interface between the ZnO film 14 and the gate insulating film 16. On the other hand, the MISFET using the STO substrate is a normally-off type FET because spontaneous polarization does not occur in the ZnO film 14 and no charge is induced at the interface between the ZnO film 14 and the gate insulating film 16.

Figure 15A:
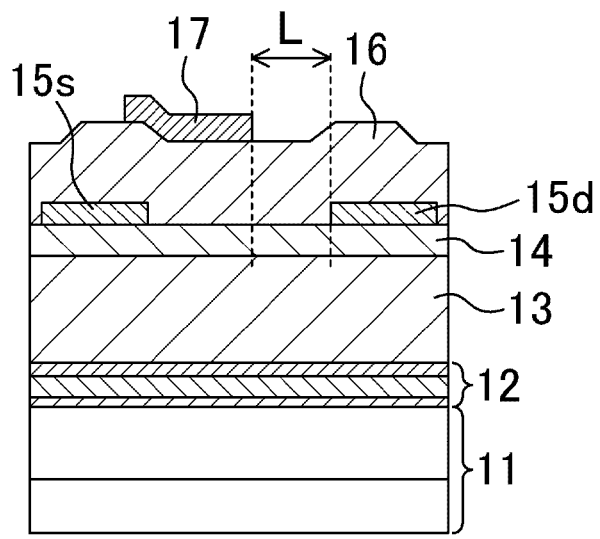
FIG. 15A is a cross-sectional view showing a configuration of a normally-on type MISFET.
Figure 15B:
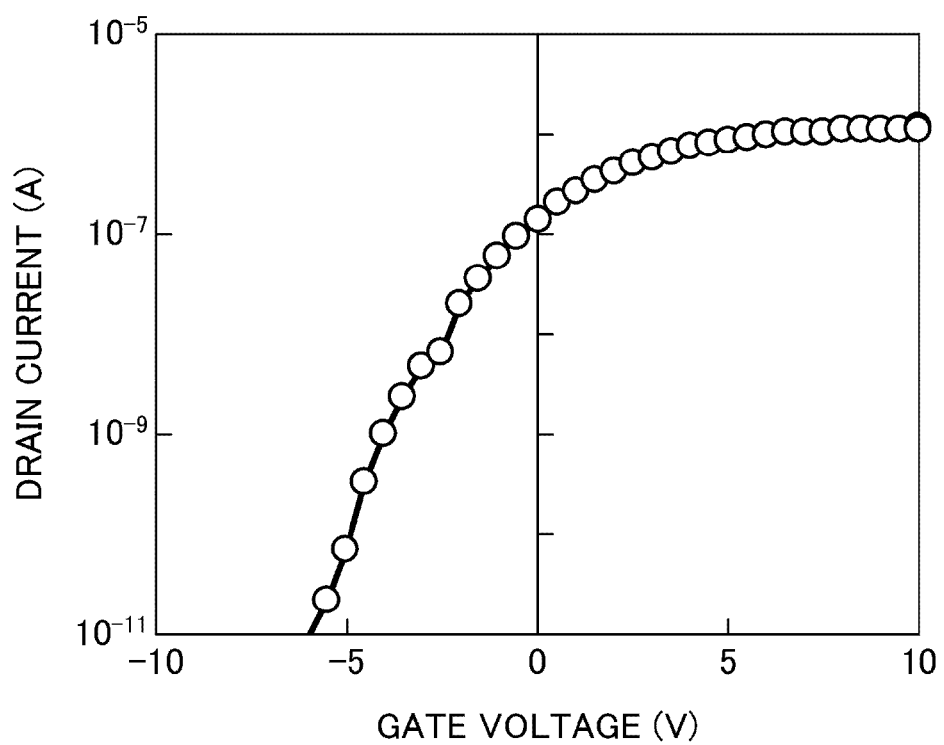
FIG. 15B is a graph showing switching characteristics of the MISFET.

As shown in FIG. 15A, a normally-on type FET was formed so that the drain electrode 15*d* is separated from an end of the second gate electrode 17 by a distance L, and switching characteristics of this FET were examined by a method similar to that shown in FIG. 14B. FIG. 15B is a graph plotting a drain current obtained by sweeping the gate voltage from −10 V to +10 V. The graph shows that the MISFET has a high resistance when a negative voltage is applied, and has a low resistance when no voltage is applied. That is, charge is induced by the ZnO film 14 in a region other than below the second gate electrode 17, and this MISFET is a normally-on type FET.

Figure 16A:
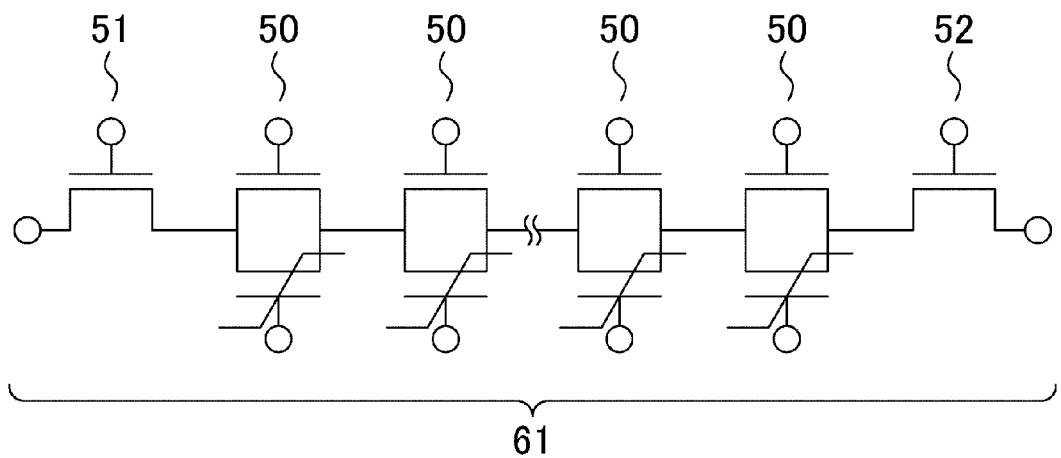
FIG. 16A is a diagram showing a configuration of a semiconductor memory device in the second embodiment of the present invention.
Figure 16B:
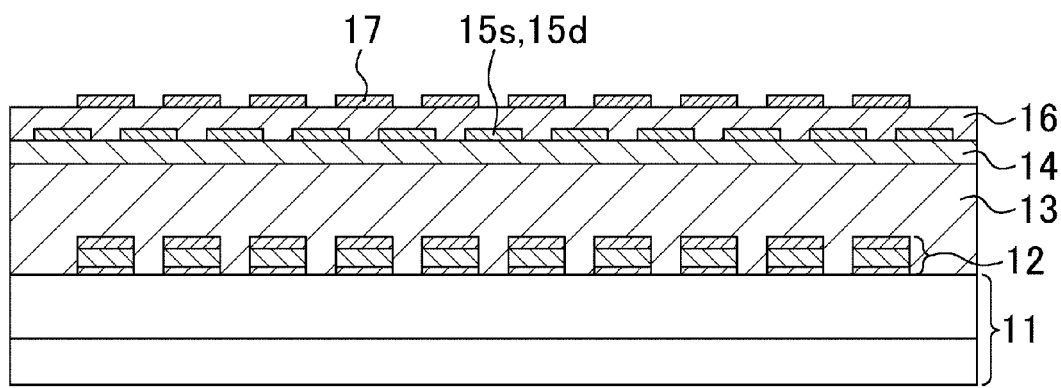
FIG. 16B is a cross-sectional view thereof.

FIG. 16A is a diagram showing a configuration of a memory block 61 of a semiconductor memory device in which a plurality of semiconductor memory cells 50 are connected in series, and select transistors 51, 52 are respectively provided at both ends of the series connection of the semiconductor memory cells 50. FIG. 16B is a cross-sectional view thereof. Note that the memory block 61 operates in the same manner as to that described in the first embodiment with reference to FIGS. 10A-10C.

That is, data is written to a selected one of the semiconductor memory cells 50 by applying a predetermined voltage to the first gate electrode of the selected semiconductor memory cell 50 and thus changing the polarization state of the ferroelectric film. Data written in a selected one of the semiconductor memory cells 50 is read by applying a predetermined voltage to the second gate electrode of the selected semiconductor memory cell 50 to turn off the select switching element, and detecting a current flowing in the channel layer according to the polarization state of the ferroelectric film.

When reading data written in each memory cell of the memory block, all the MISFETs of the non-selected memory cells are turned on. Thus, if the MISFETs are normally-on type transistors, no voltage is applied to the second gate electrodes of the MISFETs of the non-selected memory cells, and thus the data written in the non-selected memory cells is not disturbed. In the read operation, only the MISFET of the selected memory cell need be turned off, whereby power consumption can be reduced.

The semiconductor memory device (or the memory block thereof) of the present embodiment is configured as shown in FIG. 16B by connecting in series the semiconductor memory cells having the configuration of FIGS. 13A-13B. That is, in each semiconductor memory cell, the source and drain electrodes 15*s*, 15*d* are placed with the second gate electrode 17 interposed therebetween.

However, if normally-on type TFTs are used as the MISFETs (the select switching elements) of the semiconductor memory cells, charge is induced even by the semiconductor film 14 located below the second gate electrode 17, as shown in FIGS. 15A-15B. Thus, the MISFETs are normally on.

Figure 17:
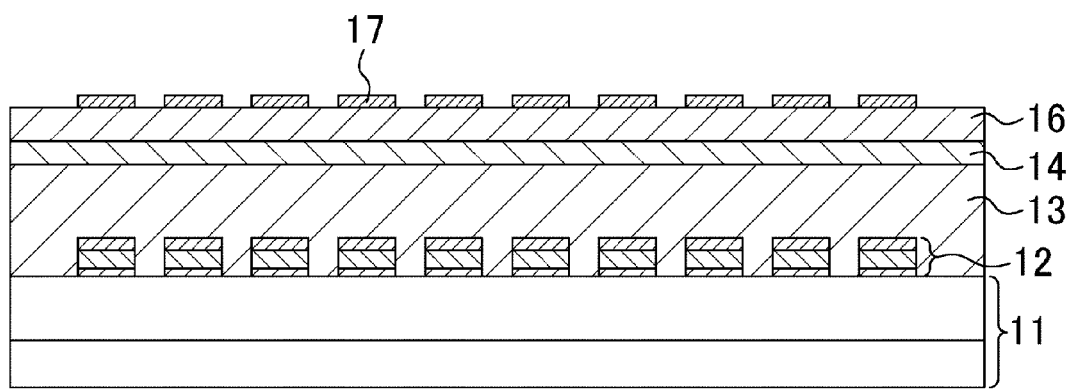
FIG. 17 is a diagram showing a configuration of a semiconductor memory device in a modification of the second embodiment.

Thus, as shown in FIG. 17, a semiconductor memory device having normally-on type MISFETs connected in series can be configured without providing source/drain electrodes in each semiconductor memory cell. This enables the semiconductor memory device having a small cell size to be implemented.

As shown in FIG. 16B, the first gate electrodes 12 are formed separately for each semiconductor memory cell. Thus, the Pt film, etc. controlling the (0001) orientation of the ZnO film 14 is not formed over the entire surface below the ZnO film (the semiconductor film) 14. Accordingly, the orientation of the ZnO film 14 is controlled in the regions where the Pt film is present below the ZnO film 14, but is not controlled in the regions where the Pt film is not present below the ZnO film 14. However, the ZnO film 14 whose orientation is not controlled tends to be in a low resistance state due to reduction in oxygen, etc. Since the ZnO film 14 is in the low resistance state in the regions where the source and drain regions are normally provided, the semiconductor memory device having the normally-on type MISFETs connected in series can be configured without providing the source and drain electrodes.

A manufacturing method of the semiconductor memory device of the present embodiment will be described below with reference to FIGS. 18A-18E. Note that in the case where the semiconductor memory device (or the memory block thereof) is configured by connecting the semiconductor memory cells of FIGS. 13A-13B in series, the ferroelectric film 13, the semiconductor film 14, and the paraelectric film 16 are typically continuously formed in the entire memory block. Thus, a manufacturing method of the semiconductor memory cell will be described.

Figure 18A:
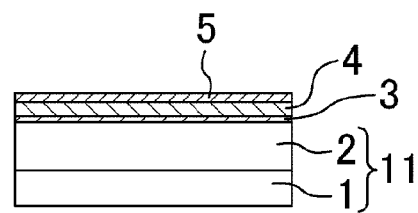
FIGS. 18A-18E are diagrams illustrating a manufacturing method of the semiconductor memory cell in the second embodiment of the present invention.

First, as shown in FIG. 18A, a SiO$_2$ film 2 having a thickness of 200 nm is formed on the surface of a Si substrate 1 by thermal oxidation. Next, a Ti film 3 having a thickness of 5 nm and a Pt film 4 having a thickness of 30 nm are formed over the SiO$_2$ film by using a sputtering method. An SRO film 5 having a thickness of 15 nm is further formed thereon at a substrate temperature of 700° C. by a pulsed laser deposition (PLD) method.

Figure 18B:
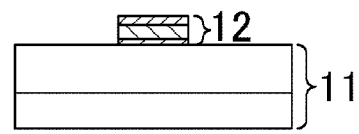

Then, as shown in FIG. 18B, a patterned resist film (not shown) is formed on the SRO film 5, and the SRO film 5, the PT film 4, and the Ti film 3 are etched by an ion milling method to form a first electrode 12.

Figure 18C:
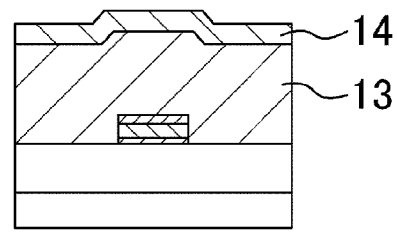

Thereafter, as shown in FIG. 18C, a gate insulating film 13 made of a ferroelectric film, PZT, is formed with a thickness of 450 nm over the substrate 11 at a substrate temperature of 700° C. so as to cover the gate electrode 12. At this time, a sintered compact used as a target has a composition of Pb:Zr:Ti=1:0.3:0.7. In this composition, a lattice mismatch between the Pt film 3 and the SRO and PZT films 5, 13 is within 3%, and the SRO film and the PZT film can be epitaxially grown over the Pt film 3 under the above growth conditions. Then, a semiconductor film 14 made of ZnO is formed with a thickness of about 30 nm at a substrate temperature of 400° C. in the same chamber of a PLD apparatus.

Figure 18D:
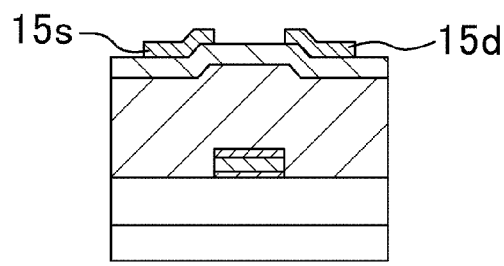

Then, as shown in FIG. 18D, a patterned resist film (not shown) is formed on the semiconductor film 14, and a Ti film having a thickness of 20 nm and a Pt film having a thickness of 30 nm are formed by an electron beam deposition method, and source/drain electrodes 15s, 15d are formed at predetermined positions by an etchback method.

Figure 18E:
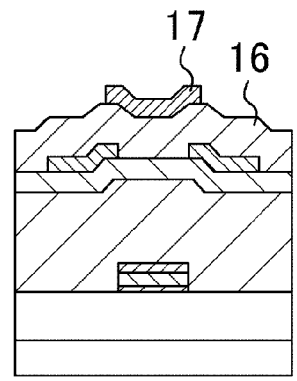

Subsequently, as shown in FIG. 18E, a gate insulating film 16 made of a paraelectric film, $Al_2O_3$, is formed by an atomic layer deposition (ALD) method. A patterned resist film (not shown) is formed thereon, an Ir film having a thickness of 200 nm is formed by a sputtering method, and a second gate electrode 17 is formed at a predetermined position by an etchback method. The semiconductor memory cell shown in FIG. 13A is manufactured in this manner.

(Third Embodiment)

The semiconductor memory device that does not cause disturbance in read operation of the semiconductor memory cells is described in the second embodiment. A semiconductor memory device that does not cause disturbance in write operation to semiconductor memory cells will be described in a third embodiment of the present invention.

Write operation to the semiconductor memory cells (hereinafter simply referred to as the "memory cells") arranged in an array will be described with reference to FIGS. 19A-22B. An example will be described in which memory cells 20A-20F are arranged in three rows by two columns. MISFETs forming select switching elements of the memory cells are of a normally-on type.

Figure 19A:
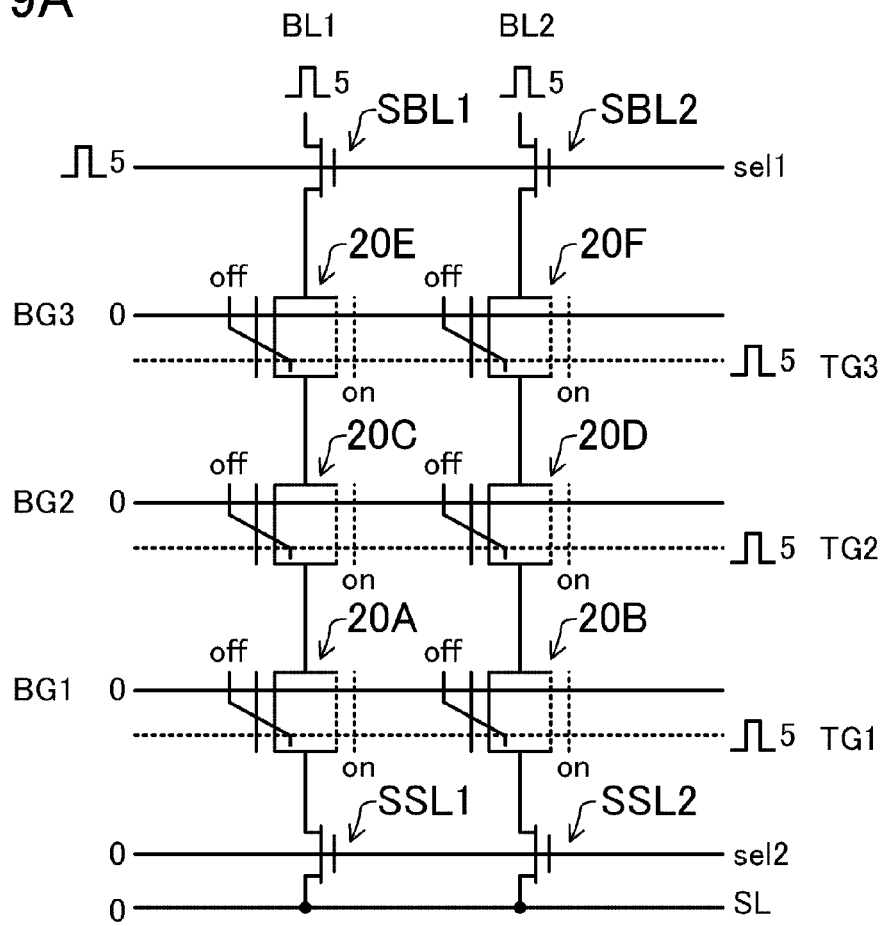
FIG. 19A is a circuit diagram showing a layout of semiconductor memory cells in a third embodiment of the present invention.

First, reset operation that is performed before write operation will be described with reference to FIGS. 19A-19B. FIG. 19A is a circuit diagram showing a memory cell layout, and FIG. 19B is a timing chart of the reset operation.

As shown in FIG. 19A, of the memory cells 20A, 20C, 20E and 20B, 20D, 20F connected in the column direction, the memory cells 20A, 20B located at one end of each column are connected to a source line SL having a ground potential, and the memory cells 20E, 20F located at the other end of each column are respectively connected to bit lines BL1, BL2 to which a write voltage is applied.

Figure 19B:
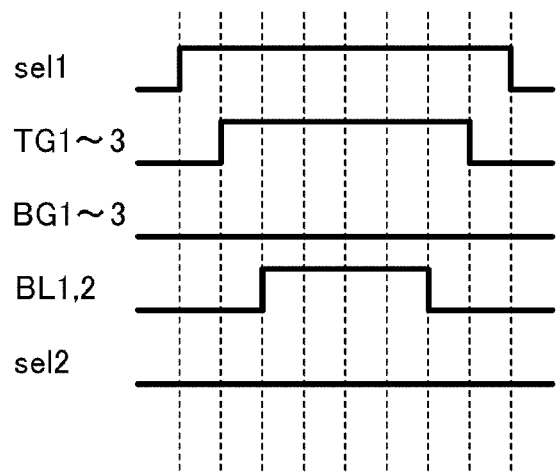
FIG. 19B is a timing chart illustrating reset operation.

As shown in FIG. 19B, a pulse signal sel1 is applied to turn on select transistors SBL1, SBL2. However, the pulse signal sel1 need not be applied in the case where the select transistors SBL1, SBL2 are of a normally-on type like the MISFETs. A voltage of 5 V is applied to second gate electrodes TG1-TG3 of select switching elements (MISFETs) of all the memory cells to turn on the MISFETs of all the memory cells. Moreover, a voltage of 0 V is applied to first gate electrodes BG1-BG3 of memory elements (MFSFETs) of all the memory cells. A voltage of 5 V is applied to the bit lines BL1, BL2. Since the MISFETs of all the memory cells are on, the voltage applied to the bit lines BL1, BL2 reaches all the memory cells with no voltage drop. Since the voltage of 5 V is applied to drain electrodes of the MFSFETs and the voltage of 0 V is applied to the first gate electrodes BG1-BG3 in all the memory cells, all the MFSFETs are reset to an off state. That is, the reset operation is performed to orient the polarization of the ferroelectric film in the memory element in the same direction in all the memory cells.

After the reset operation, write operation to the plurality of memory cells connected in the row direction is performed sequentially from the row located closer to the source line SL to the row located closer to the bit line after the reset operation. This will be described below.

Figure 20A:
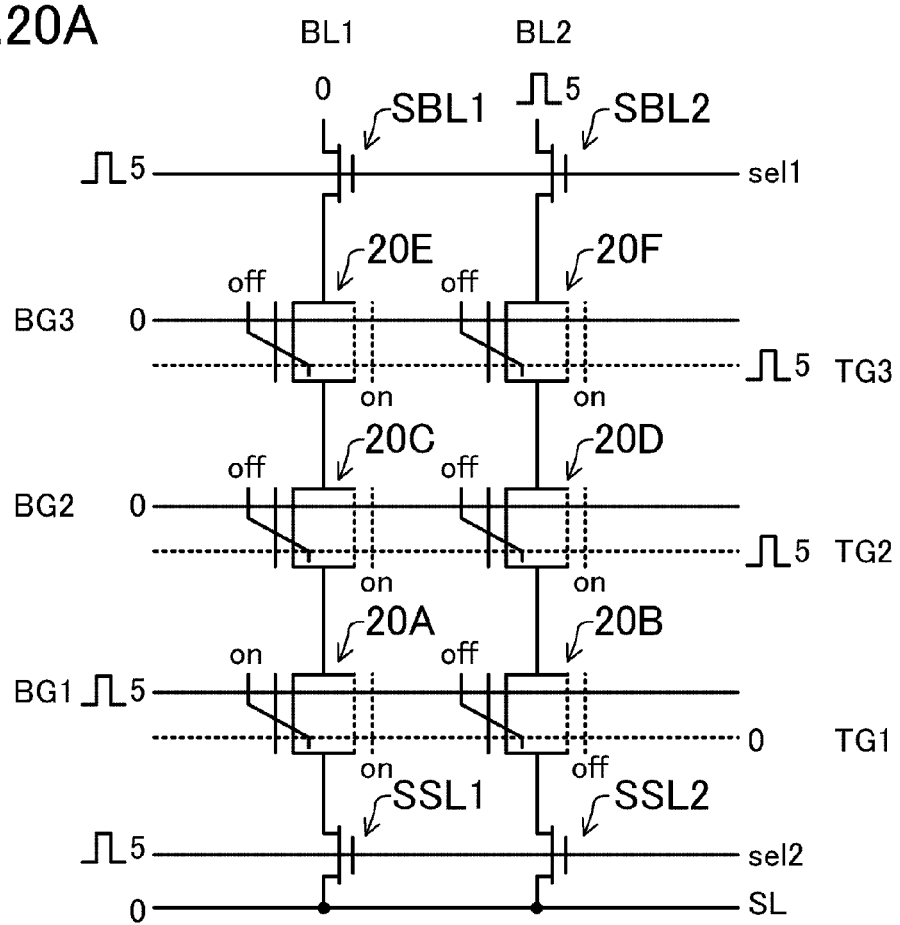
FIG. 20A is a circuit diagram showing the layout of the semiconductor memory cells in the third embodiment of the present invention.
Figure 20B:
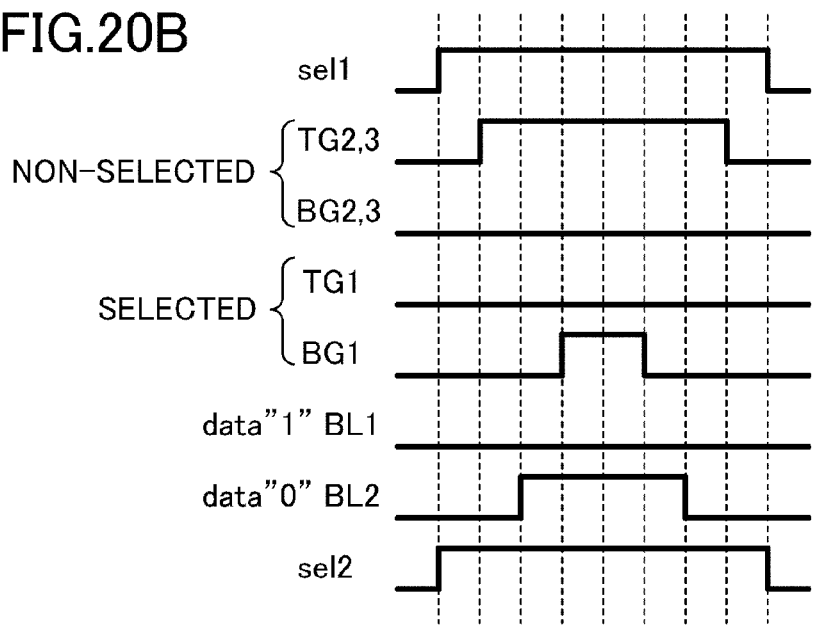
FIG. 20B is a timing chart illustrating write operation.

FIGS. 20A-20B are diagrams illustrating write operation to the memory cells 20A, 20B arranged in the closest row to the source line SL. FIG. 20A is a circuit diagram showing a memory cell layout, and FIG. 20B is a timing chart of the write operation.

As shown in FIG. 20B, a pulse signal sel1 is applied to turn on the select transistors SBL1, SBL2. A pulse signal sel2 is also applied to turn on select transistors SSL1, SSL2. A voltage of 5 V is applied to the second gate electrodes TG2, TG3 of the MISFETs of the memory cells 20C, 20D, 20E, 20F in the non-selected rows, and a voltage of 0 V is applied to the second gate electrode TG1 of the MISFETs of the memory cells 20A, 20B in the selected row. A write voltage of 0 V and 5 V is applied to the bit lines BL1, BL2, respectively. Then, a voltage of 0 V is applied to the first gate electrodes BG2, BG3 of the MFSFETs of the memory cells 20C, 20D, 20E, 20F in the non-selected rows, and a voltage of 5 V is applied to the first gate electrode BG1 of the MFSFETs of the memory cells 20A, 20B in the selected row.

At this time, since the MISFETs of the memory cells 20C, 20E are on, the voltage of 0 V on the bit line BL1 is applied as it is to the drain electrode of the MFSFET of the memory cell 20A in the selected row. Since the voltage of 5 V is applied to the first gate electrode BG1 of the MFSFET of the memory cell 20A, the polarization of the ferroelectric film of this MFSFET is reversed, and this MFSFET is turned on.

On the other hand, since the MISFETs of the memory cells 20D, 20F are on, the voltage of 5 V on the bit line BL2 is applied as it is to the drain electrode of the MFSFET of the memory cell 20B in the selected row. However, since the voltage of 5 V is also applied to the first gate electrode BG1 of the MFSFET of the memory cell 20B, no polarization reversal occurs in the ferroelectric film of this MFSFET, and this MFSFET is kept in an off state.

That is, of the memory cells arranged in the selected row, data "1" (the MFSFET is on) is written to the memory cell 20A connected to the bit line BL1, and data "0" (the MFSFET is off) is written to the memory cell 20B connected to the bit line BL2, by the above write operation.

Note that of the memory cells in the non-selected rows to which data has not been written yet, the voltage of 0 V is applied to the drain electrodes and the first gate electrodes BG2, BG3 of the MFSFETs of the memory cells 20C, 20E connected to the bit line BL1, no polarization reversal occurs in the ferroelectric film of these MFSFETs. Since the voltage of 5 V is applied to the drain electrodes and the first gate electrodes BG2, BG3 of the MFSFETs of the memory cells 20D, 20F connected to the bit line BL2, no polarization reversal occurs in the ferroelectric film of these MFSFETs. Thus, the memory cells in the non-selected state are kept in the reset state when writing data to the memory cells in the selected row.

Figure 21A:
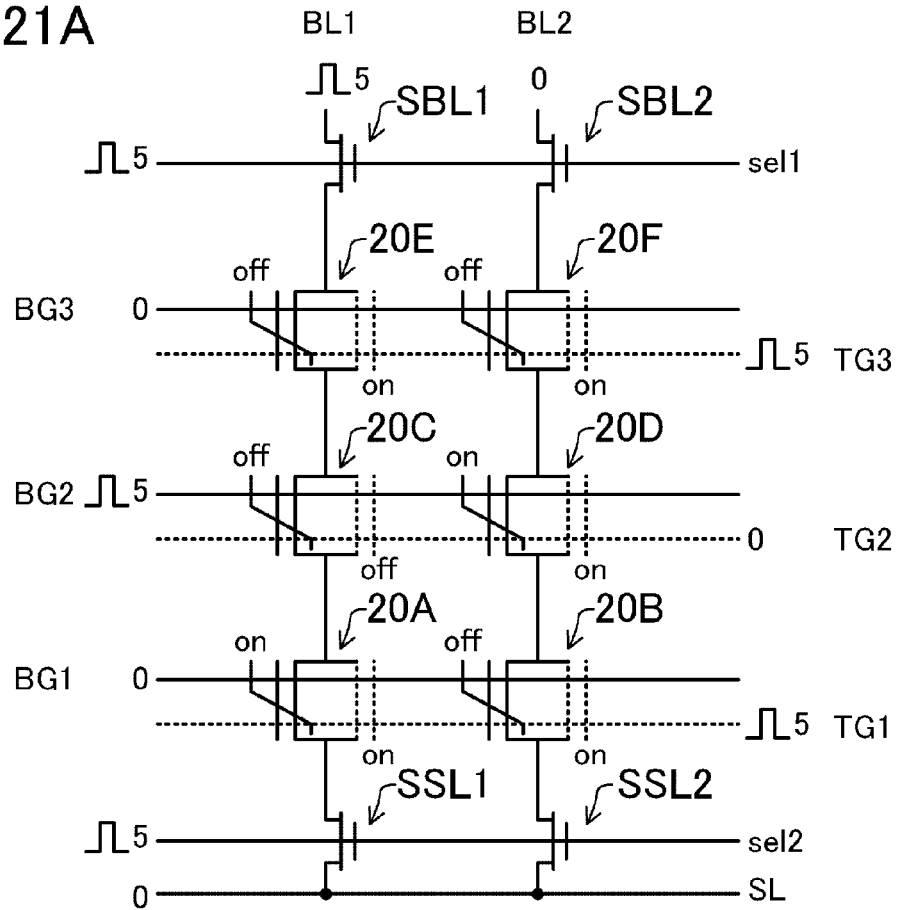
FIG. 21A is a circuit diagram showing the layout of the semiconductor memory cells in the third embodiment of the present invention.

Write operation to the memory cells 20C, 20D arranged in the second closest row to the source line SL will be described with reference to FIGS. 21A-21B.

Figure 21B:
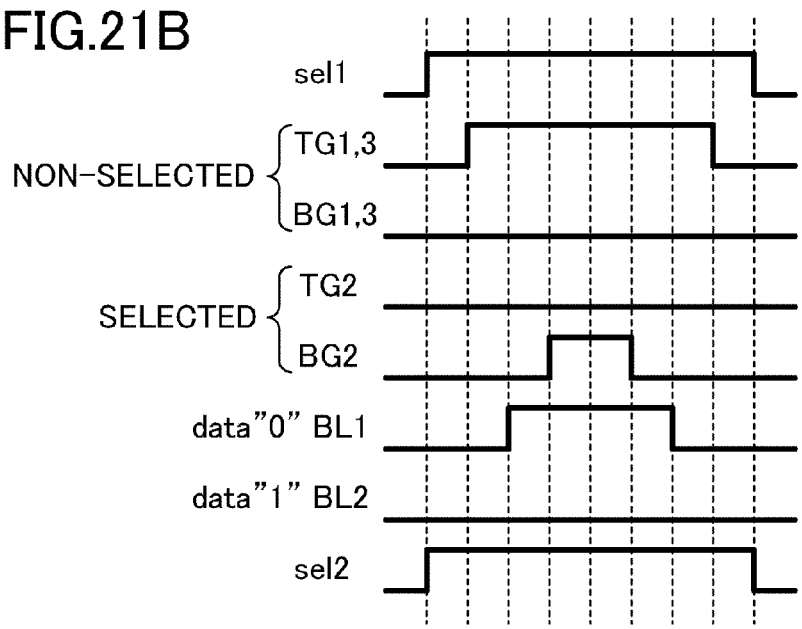
FIG. 21B is a timing chart illustrating the write operation.

As shown in FIG. 21B, a pulse signal sel1 is applied to turn on the select transistors SBL1, SBL2. A pulse signal sel2 is also applied to turn on the select transistors SSL1, SSL2. A voltage of 5 V is applied to the second gate electrodes TG1, TG3 of the MISFETs of the memory cells 20A, 20B, 20E, 20F in the non-selected rows, and a voltage of 0 V is applied to the second gate electrode TG2 of the MISFETs of the memory cells 20C, 20D in the selected row. A write voltage of 5 V and 0 V is applied to the bit lines BL1, BL2, respectively. Then, a voltage of 0 V is applied to the first gate electrodes BG1, BG3 of the MFSFETs of the memory cells 20A, 20B, 20E, 20F in the non-selected rows, and a voltage of 5 V is applied to the first gate electrode BG2 of the MFSFETs of the memory cells 20C, 20D in the selected row.

At this time, since the MISFET of the memory cell 20E is on, the voltage of 5 V on the bit line BL1 is applied as it is to the drain electrode of the MFSFET of the memory cell 20C in the selected row. However, since the voltage of 5 V is also applied to the first gate electrode BG2 of the MFSFET of the memory cell 20C, no polarization reversal occurs in the ferroelectric film of this MFSFET, and this MFSFET is kept in an off state.

On the other hand, since the MISFET of the memory cell 20F is on, the voltage of 0 V on the bit line BL2 is applied as it is to the drain electrode of the MFSFET of the memory cell 20D in the selected row. Since the voltage of 5 V is applied to the first gate electrode BG2 of the MFSFET of the memory cell 20D, the polarization of the ferroelectric film of this MFSFET is reversed, and this MFSFET is turned on.

That is, of the memory cells arranged in the selected row, data "0" (the MFSFET is off) is written to the memory cell 20C connected to the bit line BL1, and data "1" (the MFSFET is on) is written to the memory cell 20D connected to the bit line BL2, by the above write operation.

Of the memory cells arranged in the selected row, the MISFET of the memory cell 20C connected to the bit line BL1 is off, because the voltage of 0 V is applied to the second gate electrode TG2 and the voltage of 5 V is applied to the drain electrode of this MISFET. Thus, the voltage of 5 V on the bit line BL1 does not reach the memory cell 20A to which the data has already written, and the same voltage of 0 V as that on the source line SL is applied to the drain electrode of the MFSFET of the memory cell 20A. Thus, even if the voltage of 0 V is applied to the first gate electrode BG1 of this MFSFET, no electric field is applied to the ferroelectric film of this MFSFET. That is, the data "1" written in the memory cell 20A is not disturbed. If the MISFET of the memory cell 20C is on, the voltage of 5 V is applied to the drain electrode of the MFSFET of the memory cell 20A, and the voltage of 0 V is applied to the first gate electrode BG1. In this case, the MFSFET of the memory cell 20A is turned off, and the data "1" that has already been written in the memory cell 20A changes to "0."

On the other hand, of the memory cells arranged in the selected row, the MISFET of the memory cell 20D connected to the bit line BL2 is on, because the voltage of 0 V is applied to the second gate electrode TG2 and the drain electrode of this MISFET. However, the voltage of 0 V is applied to the bit line BL2. Thus, even if the voltage on the bit line BL2 reaches the memory cell 20B to which the data has already written, no electric field is applied to the ferroelectric film of the MFSFET of the memory cell 20B because the voltage of 0 V is applied to the drain electrode and the first gate electrode BG1 of this MFSFET. That is, the data "0" written in the memory cell 20B is not disturbed.

Figure 22A:
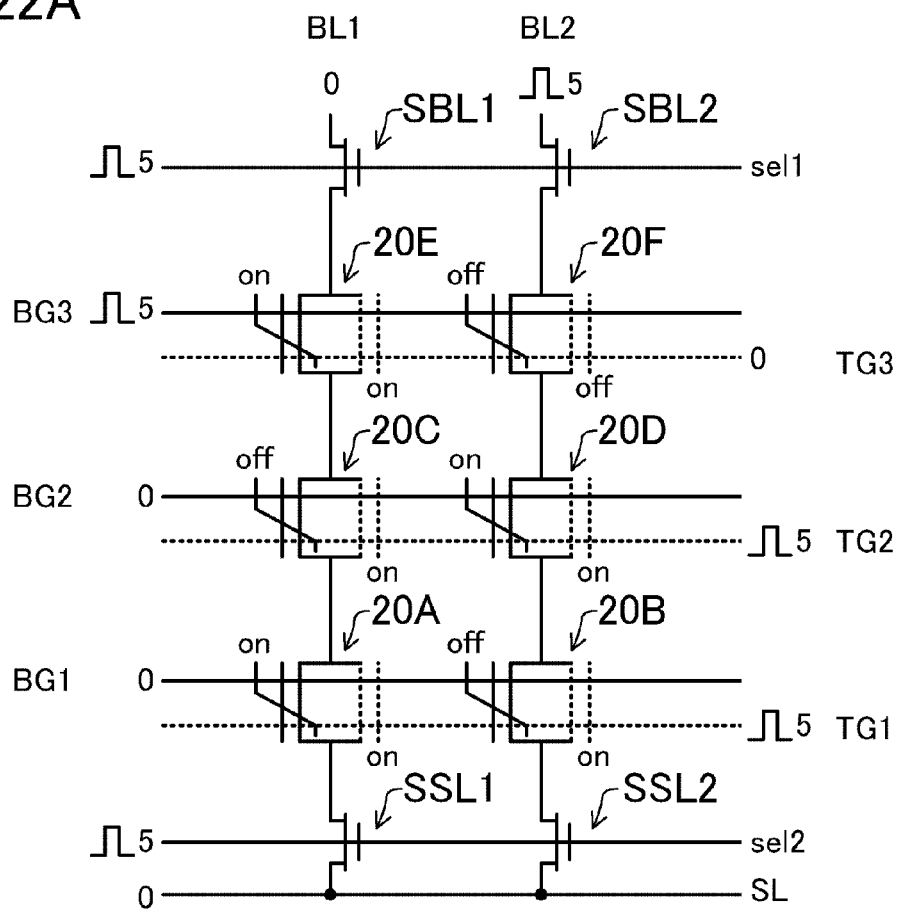
FIG. 22A is a circuit diagram showing the layout of the semiconductor memory cells in the third embodiment of the present invention.

Write operation to the memory cells 20E, 20F arranged in the closest row to the bit lines BL1, BL2 will be described with reference to FIGS. 22A-22B.

Figure 22B:
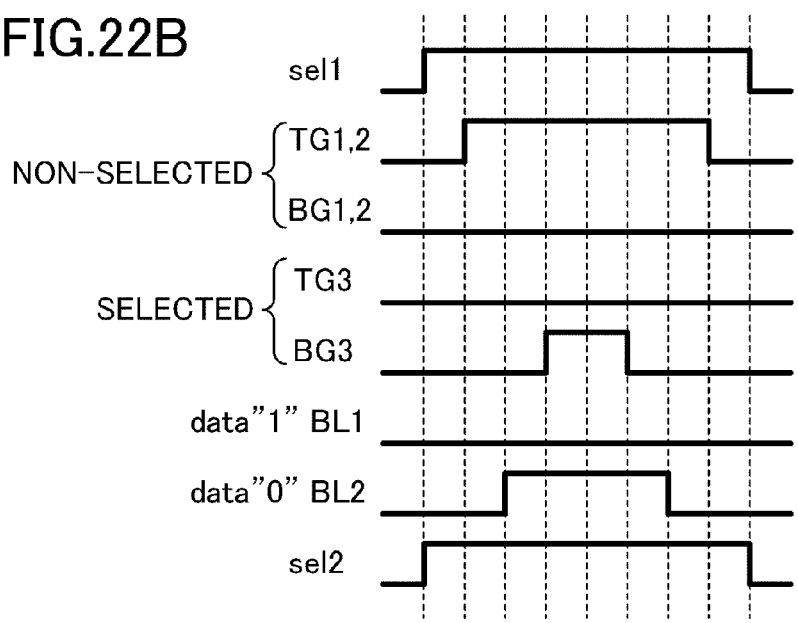
FIG. 22B is a timing chart illustrating the write operation.

As shown in FIG. 22B, a pulse signal sel1 is applied to turn on the select transistors SBL1, SBL2. A pulse signal sel2 is also applied to turn on the select transistors SSL1, SSL2. A voltage of 5 V is applied to the second gate electrodes TG1, TG2 of the MISFETs of the memory cells 20A, 20B, 20C, 20D in the non-selected rows, and a voltage of 0 V is applied to the second gate electrode TG3 of the MISFETs of the memory cells 20E, 20F in the selected row. A write voltage of 0 V and 5 V is applied to the bit lines BL1, BL2, respectively. Then, a voltage of 0 V is applied to the first gate electrodes BG1, BG2 of the MFSFETs of the memory cells 20A, 20B, 20C, 20D in the non-selected rows, and a voltage of 5 V is applied to the first gate electrode BG3 of the MFSFETs of the memory cells 20E, 20F in the selected row.

At this time, the voltage of 0 V on the bit line BL1 is applied as it is to the drain electrode of the MFSFET of the memory cell 20E in the selected row. Since the voltage of 5 V is applied to the first gate electrode BG3 of the MFSFET of the memory cell 20E, the polarization of the ferroelectric film of this MFSFET is reversed, and this MFSFET is turned on.

On the other hand, the voltage of 5 V on the bit line BL2 is applied as it is to the drain electrode of the MFSFET of the memory cell 20F in the selected row. However, since the voltage of 5 V is also applied to the first gate electrode BG3 of the MFSFET of the memory cell 20F, no polarization reversal occurs in the ferroelectric film of this MFSFET, and this MFSFET is kept in an off state.

That is, of the memory cells arranged in the selected row, data "1" (the MFSFET is on) is written to the memory cell 20E connected to the bit line BL1, and data "0" (the MFSFET is off) is written to the memory cell 20F connected to the bit line BL2, by the above write operation.

Similarly, of the memory cells arranged in the selected row, the MFSFET of the memory cell 20F connected to the bit line BL2 is off, because the voltage of 0 V is applied to the second gate electrode TG2 and the voltage of 5 V is applied to the drain electrode of this MISFET. Thus, the voltage of 5 V on the bit line BL2 does not reach the memory cells 20B, 20D to which the data has already written, and the same voltage of 0 V as that on the source line SL is applied to the drain electrodes of the MFSFETs of the memory cells 20B, 20D. Thus, even if the voltage of 0 V is applied to the first gate electrodes BG1, BG2 of these MFSFETs, no electric field is applied to the ferroelectric film of these MFSFETs. That is, the data written in the memory cells 20B, 20D is not disturbed.

On the other hand, of the memory cells arranged in the selected row, the MISFET of the memory cell 20E connected to the bit line BL1 is on, because the voltage of 0 V is applied to the second gate electrode TG2 and the drain electrode of this MISFET. However, the voltage of 0 V is applied to the bit line BL1. Thus, even if the voltage on the bit line BL1 reaches the memory cells 20A, 20C to which the data has already written, no electric field is applied to the ferroelectric film of the MFSFETs of the memory cells 20A, 20C because the voltage of 0 V is applied to the drain electrodes and the first gate electrodes BG1, BG2 of these MFSFETs. That is, the data written in the memory cells 20A, 20C is not disturbed.

As described above, the write operation to the plurality of semiconductor memory cells connected in the row direction is performed sequentially from the row located closer to the source line to the row located closer to the bit line after the reset operation. When writing data to each semiconductor memory cell in the selected row, the MISFET (the select switching element) is turned off, if the write operation is to be performed so as to turn off the MFSFET (the memory element) according to the polarization state of the ferroelectric film of the MFSFET. Thus, no electric field is applied to the ferroelectric film of the MFSFET of each memory cell to which the data has already written, whereby the written data is not disturbed.

Note that in the present embodiment, the reset operation is performed so as to turn off the MFSFETs of all the semiconductor memory cells. In this case, the expression "the write operation that is performed so as to turn off the MISFET" means "the write operation that is performed so as not to reverse the polarization state of the MFSFET created by the reset operation."

In the case where the reset operation is performed so as to turn off the MFSFETs of all the semiconductor memory cells, it is preferable to turn on the MISFETs (the select switching elements) of all the semiconductor memory cells to which the data has not been written yet, that is, to turn on the MISFETs of the semiconductor memory cells of all the rows located closer to the bit line than the selected row, in the write operation to each semiconductor memory cell in the selected row. This allows the write voltage applied to the bit line to reach the semiconductor memory cell in the selected row, whereby predetermined write operation can be performed.

In the write operation to each semiconductor memory cell in the selected row, it is preferable that the voltage applied in the reset operation be applied to the first gate electrodes of the semiconductor memory cells of all the rows located closer to the bit line than the selected row. Thus, no electric field is applied to the ferroelectric film of the MFSFETs of the semiconductor memory cells to which the data has not been written yet, whereby these MFSFETs can be kept in the reset state.

The MISFETs (the select switching elements) of the semiconductor memory cells are of a normally-on type in the above embodiment. In this case, the write operation can be performed by applying only two voltages, namely 0 V and 5 V (the voltages may have any values), to the MISFETs and the bit lines. This reduces the number of potentials required for the control, whereby the circuit configuration can be simplified. It should be understood that even if the MISFETs are of a normally-off type, the above write operation can be controlled by applying a predetermined voltage to the MISFETs and the bit lines.

A drive voltage of the MFSFETs may be equal to that of the MISFETs. This also reduces the number of potentials required for the control, whereby the circuit configuration can be simplified.

(Modification of Third Embodiment)

In the third embodiment, the MFSFETs of all the semiconductor memory cells are turned off in the reset operation. In this modification, write operation will be described which is performed when the MFSFETs of all the semiconductor memory cells are turned on in the reset operation. Note that the layout of the semiconductor memory cells is the same as the third embodiment. Detailed description of the operation that is common to the third embodiment will be omitted.

Figure 23A:
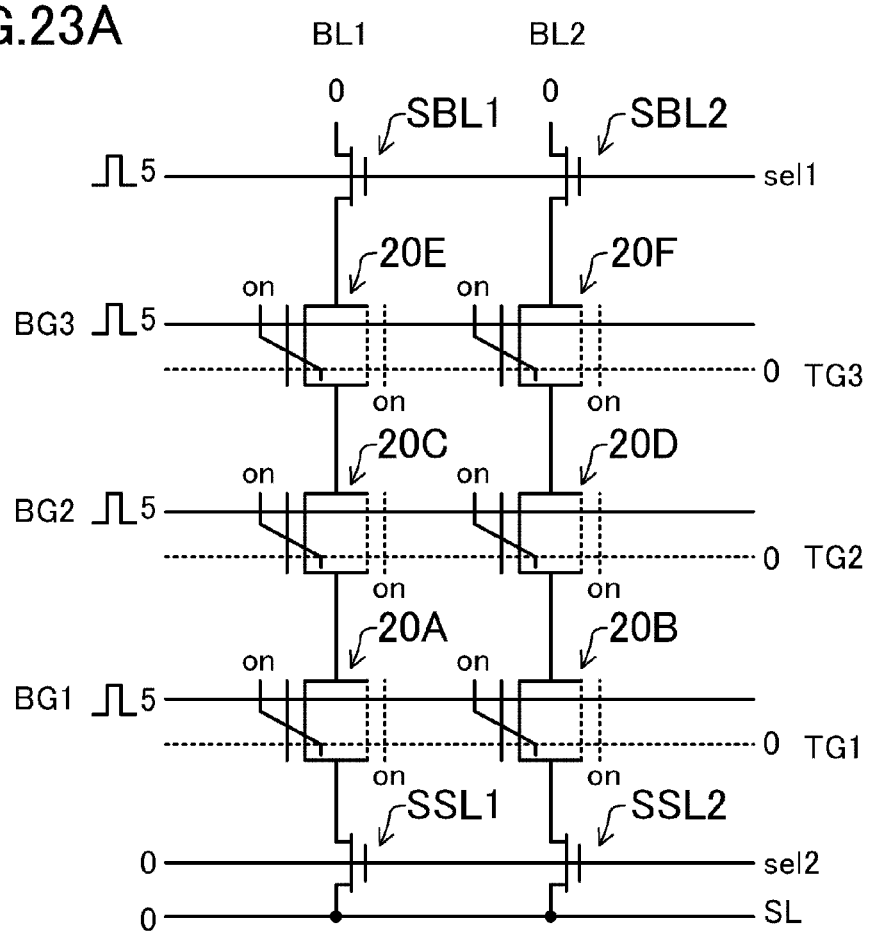
FIG. 23A is a circuit diagram showing a layout of semiconductor memory cells in a modification of the third embodiment.

First, the reset operation that is performed before the write operation to the semiconductor memory cells (hereinafter simply referred to as the "memory cells") will be described with reference to FIGS. 23A-23B. FIG. 23A is a circuit diagram showing a memory cell layout, and FIG. 23B is a timing chart of the reset operation.

Figure 23B:
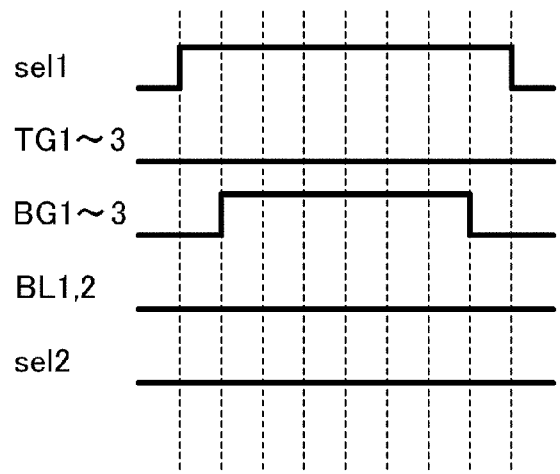
FIG. 23B is a timing chart illustrating reset operation.

As shown in FIG. 23B, a pulse signal sel1 is applied to turn on the select transistors SBL1, SBL2. However, the pulse signal sel1 need not be applied in the case where the select transistors SBL1, SBL2 are of a normally-on type like the MISFETs. A voltage of 0 V is applied to the second gate electrodes TG1-TG3 of the MISFETs of all the memory cells, and the bit lines BL1, BL2. Thus, the MISFETs (the MISFETs are of a normally-on type) of all the memory cells are turned on. Accordingly, the voltage of 0 V on the bit lines BL1, BL2 is applied to the drain electrodes of the MFSFETs of all the memory cells. A voltage of 5 V is applied to the first gate electrodes BG1-BG3 of the MFSFETs of all the memory cells. As a result, all the MFSFETs are reset to an on state.

Figure 24A:
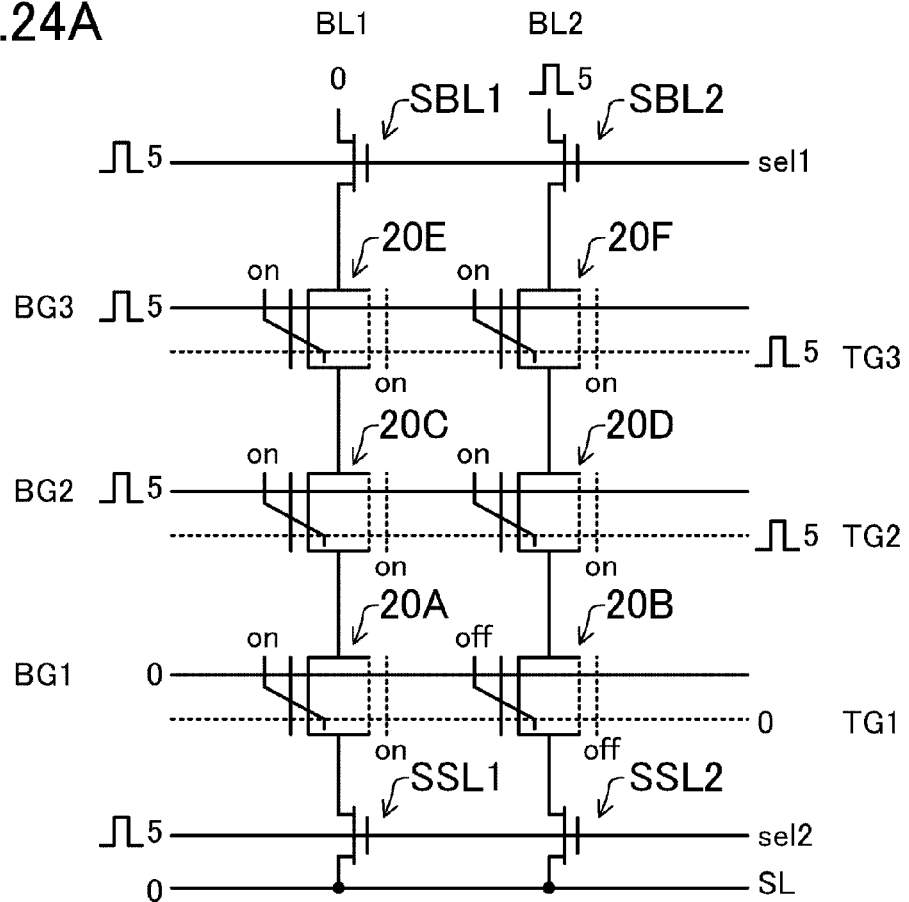
FIG. 24A is a circuit diagram showing the layout of the semiconductor memory cells in the modification of the third embodiment.

Write operation to the memory cells 20A, 20B arranged in the closest row to the source line SL will be described with reference to FIGS. 24A-24B.

Figure 24B:
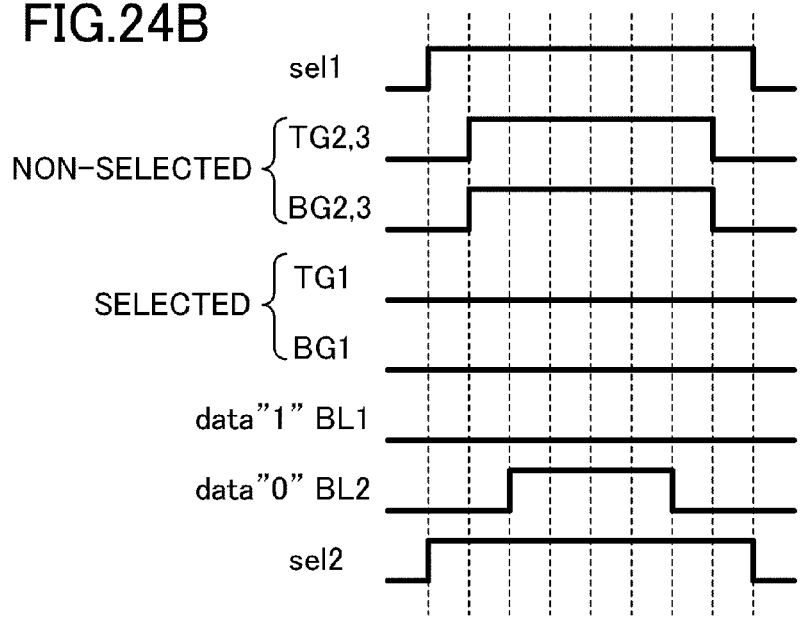
FIG. 24B is a timing chart illustrating write operation.

As shown in FIG. 24B, a pulse signal sel1 is applied to turn on the select transistors SBL1, SBL2. A pulse signal sel2 is also applied to turn on select transistors SSL1, SSL2. A voltage of 5 V is applied to the second gate electrodes TG2, TG3 of the MISFETs of the memory cells 20C, 20D, 20E, 20F in the non-selected rows, and a voltage of 0 V is applied to the second gate electrode TG1 of the MISFETs of the memory cells 20A, 20B in the selected row. A write voltage of 0 V and 5 V is applied to the bit lines BL1, BL2, respectively. Then, a voltage of 5 V is applied to the first gate electrodes BG2, BG3 of the MFSFETs of the memory cells 20C, 20D, 20E, 20F in the non-selected rows, and a voltage of 0 V is applied to the first gate electrode BG1 of the MFSFETs of the memory cells 20A, 20B in the selected row.

At this time, since the MISFETs of the memory cells 20C, 20E are on, the voltage of 0 V on the bit line BL1 is applied as it is to the drain electrode of the MFSFET of the memory cell 20A in the selected row. Since the voltage of 0 V is also applied to the first gate electrode BG1 of the MFSFET of the memory cell 20A, no polarization reversal occurs in the ferroelectric film of this MFSFET, and this MFSFET is kept in an on state.

On the other hand, since the MISFETs of the memory cells 20D, 20F are on, the voltage of 5 V on the bit line BL2 is applied as it is to the drain electrode of the MFSFET of the memory cell 20B in the selected row. Since the voltage of 0 V is applied to the first gate electrode BG1 of the MFSFET of the memory cell 20B, the polarization of the ferroelectric film of this MFSFET is reversed, and this MFSFET is turned off.

That is, of the memory cells arranged in the selected row, data "1" (the MFSFET is on) is written to the memory cell 20A connected to the bit line BL1, and data "0" (the MFSFET is off) is written to the memory cell 20B connected to the bit line BL2, by the above write operation.

Note that of the memory cells in the non-selected rows to which data has not been written yet, the voltage of 5 V is applied to the drain electrodes and the first gate electrodes BG2, BG3 of the MFSFETs of the memory cells 20C, 20E connected to the bit line BL1, no polarization reversal occurs in the ferroelectric film of these MFSFETs. Since the voltage of 5 V is applied to the drain electrodes and the first gate electrodes BG2, BG3 of the MFSFETs of the memory cells 20D, 20F connected to the bit line BL2, no polarization reversal occurs in the ferroelectric film of these MFSFETs. Thus, the memory cells in the non-selected state are kept in the reset state when writing data to the memory cells in the selected row.

Figure 25A:
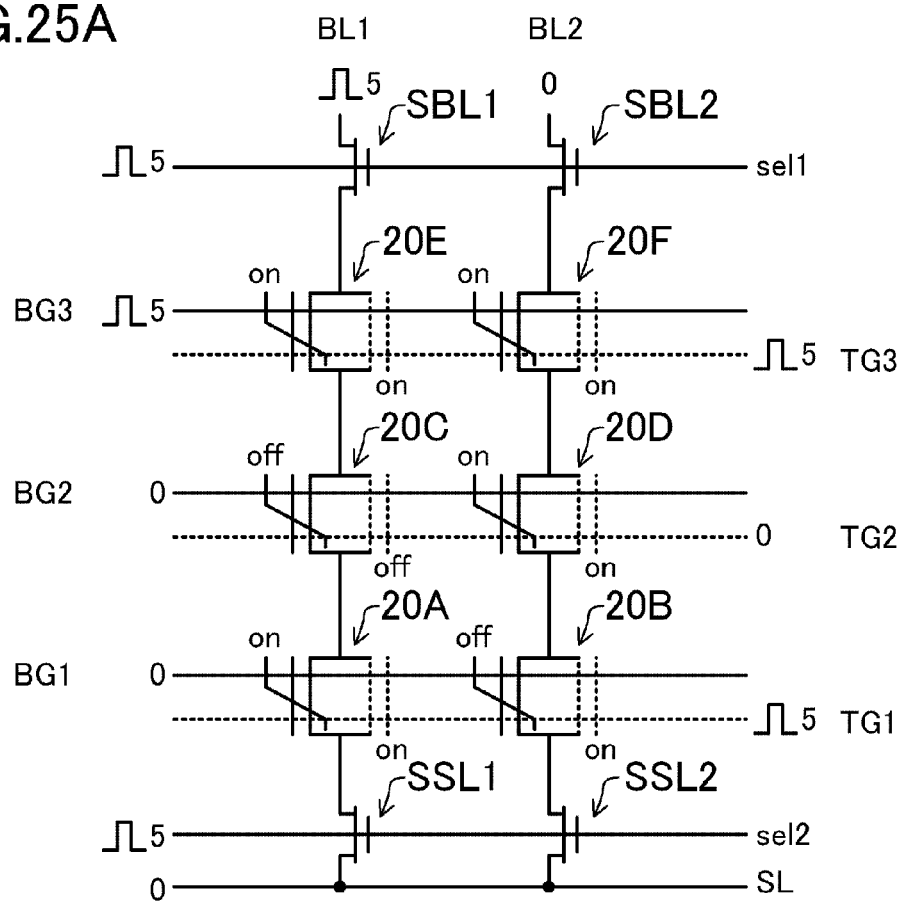
FIG. 25A is a circuit diagram showing the layout of the semiconductor memory cells in the modification of the third embodiment.

Write operation to the memory cells 20C, 20D arranged in the second closest row to the source line SL will be described with reference to FIGS. 25A-25B.

Figure 25B:
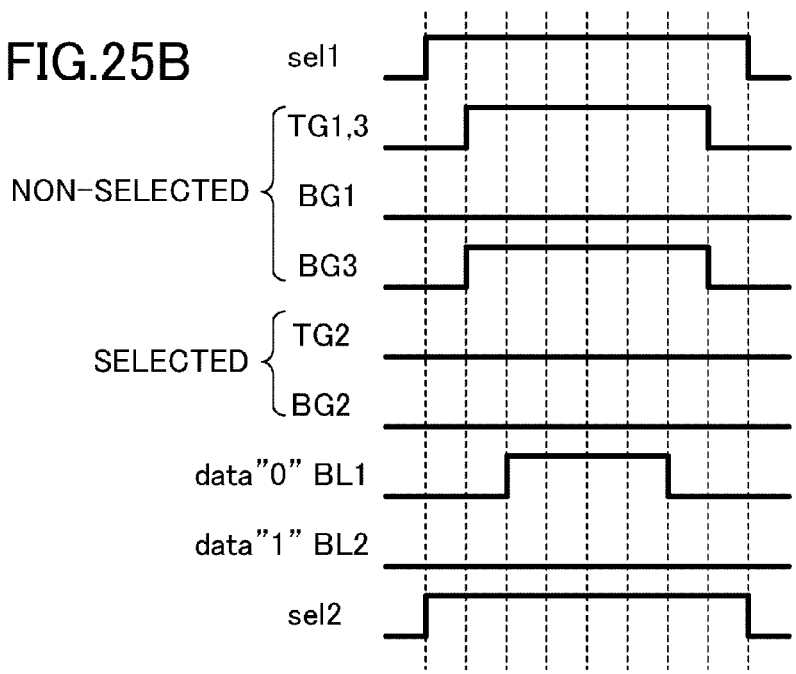
FIG. 25B is a timing chart illustrating the write operation.

As shown in FIG. 25B, a pulse signal sel1 is applied to turn on the select transistors SBL1, SBL2. A pulse signal sel2 is also applied to turn on the select transistors SSL1, SSL2. A voltage of 5 V is applied to the second gate electrodes TG1, TG3 of the MISFETs of the memory cells 20A, 20B, 20E, 20F in the non-selected rows, and a voltage of 0 V is applied to the second gate electrode TG2 of the MISFETs of the memory cells 20C, 20D in the selected row. A write voltage of 5 V and 0 V is applied to the bit lines BL1, BL2, respectively. Then, of the memory cells in the non-selected rows, a voltage of 0 V is applied to the first gate electrodes BG1 of the MFSFETs of the memory cells 20A, 20B to which the data has already been written, and a voltage of 5 V is applied to the first gate electrode BG3 of the MFSFETs of the memory cells 20E, 20F to which the data has not been written yet. On the other hand, a voltage of 0 V is applied to the first gate electrode BG2 of the MFSFETs of the memory cells 20C, 20D in the selected row.

At this time, since the MISFET of the memory cell 20E is on, the voltage of 5 V on the bit line BL1 is applied as it is to the drain electrode of the MFSFET of the memory cell 20C in the selected row. Since the voltage of 0 V is applied to the first gate electrode BG2 of the MFSFET of the memory cell 20C, the polarization of the ferroelectric film of this MFSFET is reversed, and this MFSFET is turned off.

On the other hand, since the MISFET of the memory cell 20F is on, the voltage of 0 V on the bit line BL2 is applied as it is to the drain electrode of the MFSFET of the memory cell 20D in the selected row. Since the voltage of 0 V is also applied to the first gate electrode BG2 of the MFSFET of the memory cell 20D, no polarization reversal occurs in the ferroelectric film of this MFSFET, and this MFSFET is kept in an on state.

That is, of the memory cells arranged in the selected row, data "0" (the MFSFET is off) is written to the memory cell 20C connected to the bit line BL1, and data "1" (the MFSFET is on) is written to the memory cell 20D connected to the bit line BL2, by the above write operation.

Of the memory cells arranged in the selected row, the MISFET of the memory cell 20C connected to the bit line BL1 is off, because the voltage of 0 V is applied to the second gate electrode TG2 and the voltage of 5 V is applied to the drain electrode of this MISFET. Thus, the voltage of 5 V on the bit line BL1 does not reach the memory cell 20A to which the data has already written, and the same voltage of 0 V as that on the source line SL is applied to the drain electrode of the MFSFET of the memory cell 20A. Thus, even if the voltage of 0 V is applied to the first gate electrode BG1 of this MFSFET, no electric field is applied to the ferroelectric film of this MFSFET. That is, the data "1" written in the memory cell 20A is not disturbed.

On the other hand, of the memory cells arranged in the selected row, the MISFET of the memory cell 20D connected to the bit line BL2 is on, because the voltage of 0 V is applied to the second gate electrode TG2 and the drain electrode of this MISFET. However, the voltage of 0 V is applied to the bit line BL2. Thus, even if the voltage on the bit line BL2 reaches the memory cell 20B to which the data has already written, no electric field is applied to the ferroelectric film of the MFSFET of the memory cell 20B because the voltage of 0 V is applied to the drain electrode and the first gate electrode BG1 of this MFSFET. That is, the data "0" written in the memory cell 20B is not disturbed.

Figure 26A:
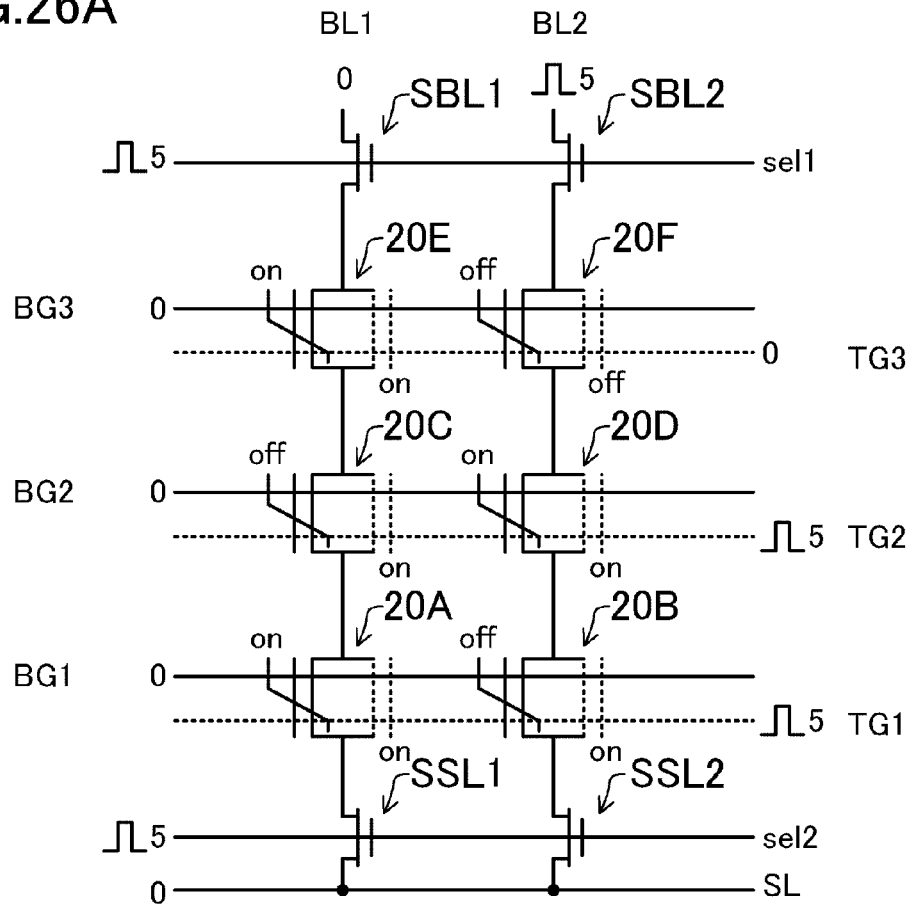
FIG. 26A is a circuit diagram showing the layout of the semiconductor memory cells in the modification of the third embodiment.

Write operation to the memory cells 20E, 20F arranged in the closest row to the bit lines BL1, BL2 will be described with reference to FIGS. 26A-26B.

Figure 26B:
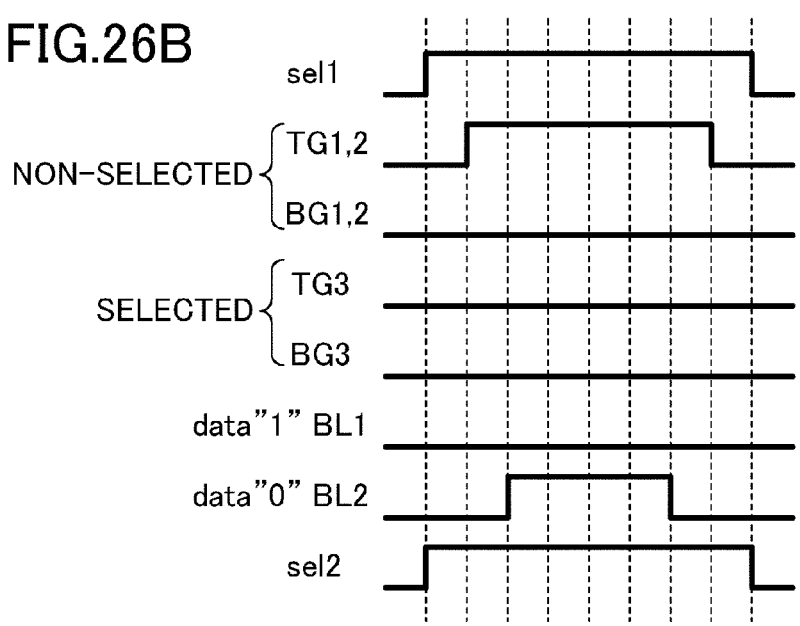
FIG. 26B is a timing chart illustrating the write operation.
Figure 27:
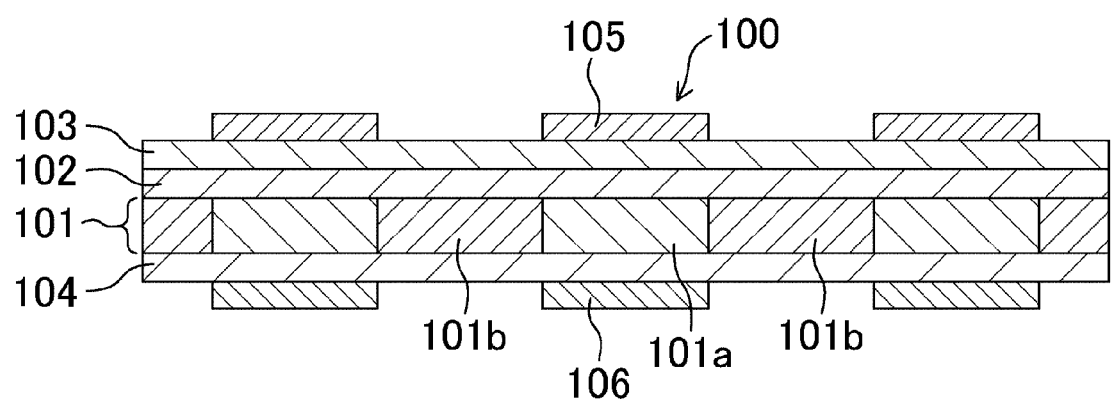
FIG. 27 is a diagram showing a configuration of a conventional semiconductor memory cell.

As shown in FIG. 26B, a pulse signal sel1 is applied to turn on the select transistors SBL1, SBL2. A pulse signal sel2 is also applied to turn on the select transistors SSL1, SSL2. A voltage of 5 V is applied to the second gate electrodes TG1, TG2 of the MISFETs of the memory cells 20A, 20B, 20C, 20D in the non-selected rows, and a voltage of 0 V is applied to the second gate electrode TG3 of the MISFETs of the memory cells 20E, 20F in the selected row. A write voltage of 0 V and 5 V is applied to the bit lines BL1, BL2, respectively.

Then, a voltage of 0 V is applied to the first gate electrodes BG1, BG2 of the MFSFETs of the memory cells 20A, 20B, 20C, 20D in the non-selected rows, and a voltage of 0 V is applied to the first gate electrode BG3 of the MFSFETs of the memory cells 20E, 20F in the selected row.

At this time, the voltage of 0 V on the bit line BL1 is applied as it is to the drain electrode of the MFSFET of the memory cell 20E in the selected row. However, since the voltage of 0 V is also applied to the first gate electrode BG3 of the MFSFET of the memory cell 20E, no polarization reversal occurs in the ferroelectric film of this MFSFET, and this MFSFET is kept in an on state.

On the other hand, the voltage of 5 V on the bit line BL2 is applied as it is to the drain electrode of the MFSFET of the memory cell 20F in the selected row. Since the voltage of 0 V is applied to the first gate electrode BG3 of the MFSFET of the memory cell 20F, the polarization of the ferroelectric film of this MFSFET is reversed, and this MFSFET is turned off.

That is, of the memory cells arranged in the selected row, data "1" (the MFSFET is on) is written to the memory cell 20E connected to the bit line BL1, and data "0" (the MFSFET is off) is written to the memory cell 20F connected to the bit line BL2, by the above write operation.

Of the memory cells arranged in the selected row, the MISFET of the memory cell 20F connected to the bit line BL2 is off, because the voltage of 0 V is applied to the second gate electrode TG3 and the voltage of 5 V is applied to the drain electrode of this MISFET. Thus, the voltage of 5 V on the bit line BL2 does not reach the memory cells 20B, 20D to which the data has already written, and the same voltage of 0 V as that on the source line SL is applied to the drain electrodes of the MFSFETs of the memory cells 20B, 20D. Thus, even if the voltage of 0 V is applied to the first gate electrodes BG1, BG2 of these MFSFETs, no electric field is applied to the ferroelectric film of these MFSFETs. That is, the data written in the memory cells 20B, 20D is not disturbed.

On the other hand, of the memory cells arranged in the selected row, the MISFET of the memory cell 20E connected to the bit line BL1 is on, because the voltage of 0 V is applied to the second gate electrode TG3 and the drain electrode of this MISFET. However, the voltage of 0 V is applied to the bit line BL1. Thus, even if the voltage on the bit line BL1 reaches the memory cells 20A, 20C to which the data has already written, no electric field is applied to the ferroelectric film of the MFSFETs of the memory cells 20A, 20C because the voltage of 0 V is applied to the drain electrodes and the first gate electrodes BG1, BG2 of these MFSFETs. That is, the data written in the memory cells 20A, 20C is not disturbed.

As described above, the write operation to the plurality of memory cells connected in the row direction is performed sequentially from the row located closer to the source line SL to the row located closer to the bit line after the reset operation. When writing data to each semiconductor memory cell in the selected row, the MISFET (the select switching element) is turned off, if the write operation is to be performed so as to turn off the MFSFET (the memory element) according to the polarization state of the ferroelectric film of the MFSFET. Thus, no electric field is applied to the ferroelectric film of the MFSFET of each memory cell to which the data has already written, whereby the written data is not disturbed.

Note that in the present embodiment, the reset operation is performed so as to turn on the MFSFETs of all the semiconductor memory cells. In this case, the expression "the write operation that is performed so as to turn off the MISFET" means "the write operation that is performed so as to reverse the polarization state of the MFSFET created by the reset operation."

As in the case where the reset operation is performed so as to turn off the MFSFETs of all the semiconductor memory cells, even in the case where the reset operation is performed so as to turn on the MFSFETs of all the semiconductor memory cells, it is preferable to turn on the MISFETs (the select switching elements) of all the semiconductor memory cells to which the data has not been written yet, that is, to turn on the MISFETs of the semiconductor memory cells of all the rows located closer to the bit line than the selected row, in the write operation to each semiconductor memory cell in the selected row. This allows the write voltage applied to the bit line to reach the semiconductor memory cell in the selected row, whereby predetermined write operation can be performed.

In the write operation to each semiconductor memory cell in the selected row, it is preferable that the voltage applied in the reset operation be applied to the first gate electrodes of the semiconductor memory cells of all the rows located closer to the bit line than the selected row. Thus, no electric field is applied to the ferroelectric film of the MFSFETs of the semiconductor memory cells to which the data has not been written yet, whereby these MFSFETs can be kept in the reset state.

Note that in the present embodiment, similar advantages can be provided even when using a negative voltage or a voltage other than the voltages used in the above example. In this case as well, after the reset operation is performed so as to orient the polarization of the ferroelectric film of all the memory elements in the same direction, the write operation is performed sequentially from the row located closer to the source line. When writing data to each of the semiconductor memory cells in a selected row, the MISFET is turned off, if the write operation is to be performed so as to turn the polarization state of the ferroelectric film of the memory element to an off state of the MFSFET.

Although the present invention is described with respect to the preferred embodiments, it is to be understood that the above description is explanatory only and is not restrictive of the scope of the invention, and various modifications can be made. For example, although the source and drain electrodes $15s$, $15d$ are provided between the semiconductor film 14 and the paraelectric film 16 in the above embodiments, the source and drain electrodes $15s$, $15d$ may be provided between the semiconductor film 14 and the ferroelectric film 13.

Although the STO substrate and the Si substrate are used as the substrate 11 in the above embodiments, a substrate such as a silicon substrate having an insulating film formed thereon or a substrate made of sapphire or lanthanum aluminum oxide ($LaAlO_3$) may be used as the substrate 11. Although the PZT film is used as the ferroelectric film 13 in the above embodiments, other materials such as $SrBi_2Ta_2O_9$, $Bi_{4-x}La_xTi_3O_{12}$, etc. may be used as the ferroelectric film. Although the ZnO film is used as the semiconductor film 14 serving as the channel layer, other materials may be used as the semiconductor film 14, such as oxide semiconductors including transparent oxide semiconductors, oxide semiconductors exhibiting a superconductive property, oxide semiconductors causing Mott transition, such as $WO_3$, ITO(InO—SnO), IGZO($InGaO_3(ZnO)_5$), STO, LSCO($La_{2-x}Sr_xCua_4$), LCMO ($La_{1-x}Ca_xMnO_3$), and PCMO($Pr_{1-x}Ca_xMnO_3$), nitride semiconductors such as indium nitride (InN) and gallium nitride (GaN), etc. Although the SiN film is used as the paraelectric film 16, other materials such as a magnesium oxide film (MgO), a magnesium-doped ZnO film ($Mg_xZn_{1-z}O$), an aluminum nitride (AlN) film, an aluminum oxide ($Al_2O_3$) film, etc. may be used as the paraelectric film 16. ITO, ZiTO(Zn—In—Sn—O), etc. may be used as the electrodes.

In the second embodiment, the MISFETs are formed as normally-on type FETs by forming the first gate electrode 12 from the stacked film of SRO film/Pt film/Ti film. However, the present invention is not limited to this, and the MISFETs can be formed as normally-on type FETs by, e.g., introducing defects into the gate insulating film 16 of the MISFET, forming the gate insulating film 16 from a layer (e.g., silicon oxide nitride oxide semiconductor (SONOS)) including a charge trap layer, or controlling the work function of the second gate electrode 17.

Although a voltage of 0 V or 5 V is applied to the MISFETs, the MFSFETs, and the bit lines in the third embodiment, the present invention is not limited to this, and other voltages (including a negative voltage) may be applied thereto within a range in which the operation described above is performed.

The present invention is useful for semiconductor memory cells having a small size and having high controllability of write and read operations, or low power consumption semiconductor memory devices causing no disturbance upon driving.

What is claimed is:

1. A semiconductor memory cell, comprising:
a memory element formed by a first field effect transistor having a gate insulating film made of a ferroelectric film; and
a select switching element formed by a second field effect transistor having a gate insulating film made of a paraelectric film, wherein
the ferroelectric film and the paraelectric film are stacked together with a semiconductor film of a compound semiconductor interposed therebetween,
a first gate electrode of the first field effect transistor is formed on a side of the ferroelectric film,
a second gate electrode of the second field effect transistor is formed on a side of the paraelectric film so as to face the first gate electrode, and
the semiconductor film forms a common channel layer of the first and second field effect transistors.

2. The semiconductor memory cell of claim 1, wherein a channel resistance of the semiconductor film is independently controlled by a polarization state of the ferroelectric film and a voltage that is applied to the second gate electrode.

3. The semiconductor memory cell of claim 1, wherein the semiconductor film is made of the compound semiconductor of a same conductivity type.

4. The semiconductor memory cell of claim 1, wherein the semiconductor film is made of an oxide semiconductor or a nitride semiconductor.

5. The semiconductor memory cell of claim 1, wherein carriers in the semiconductor film are only electrons or holes.

6. The semiconductor memory cell of claim 1, wherein capacitance of the ferroelectric film is substantially equal to that of the paraelectric film.

7. The semiconductor memory cell of claim 1, wherein read operation from the memory element is performed by applying a predetermined voltage to the second gate electrode to turn off the select switching element, and detecting a current flowing in the channel layer according to a polarization state of the ferroelectric film.

8. The semiconductor memory cell of claim 1, wherein common source/drain electrodes of the first and second field effect transistors are formed on the semiconductor film so as to interpose the first and second gate electrodes between the common source/drain electrodes.

9. A method for manufacturing the semiconductor memory device of claim 1, comprising the steps of:
forming the first gate electrode on a substrate;
continuously forming the ferroelectric film and the semiconductor film of the compound semiconductor on the substrate so as to cover the first gate electrode;
forming the paraelectric film on the semiconductor film; and
forming the second gate electrode on the paraelectric film at a position facing the first gate electrode.

10. A semiconductor memory device, comprising:
multiple ones of the semiconductor memory cells of claim 1 are connected in series.

11. The semiconductor memory device of claim 10, wherein
the second field effect transistor is of a normally-on type.

12. The semiconductor memory device of claim 11, wherein
write operation to a selected one of the semiconductor memory cells is performed by applying a predetermined voltage to the first gate electrode of the selected semiconductor memory cell to change a polarization state of the ferroelectric film.

13. A semiconductor memory device, comprising:
a plurality of semiconductor memory cells arranged in an array, wherein
each of the semiconductor memory cells is configured so that a memory element formed by a first field effect transistor having a gate insulating film made of a ferroelectric film is connected in parallel with a select switching element formed by a second field effect transistor having a gate insulating film made of a paraelectric film,
the semiconductor memory cell located at one end of the semiconductor memory cells connected in a column direction is connected to a source line having a ground potential, and the semiconductor memory cell located at the other end thereof is connected to a bit line to which a write voltage is applied,
write operation to the semiconductor memory cells connected in a row direction is performed sequentially from a row located closer to the source line to a row located closer to the bit line, after reset operation is performed so as to orient polarization of the ferroelectric film of the memory elements in all the semiconductor memory cells in a same direction, and
when writing data to each of the semiconductor memory cells in a selected row, the select switching element is turned off, if the write operation is to be performed so as to turn a polarization state of the ferroelectric film of the memory element to an off state of the first field effect transistor.

14. The semiconductor memory device of claim 13, wherein
the ferroelectric film and the paraelectric film are stacked together with a semiconductor film of a compound semiconductor interposed therebetween,
a first gate electrode of the first field effect transistor is formed on a side of the ferroelectric film, and a second gate electrode of the second field effect transistor is formed on a side of the paraelectric film so as to face the first gate electrode, and
the semiconductor film forms a common channel layer of the first and second field effect transistors.

15. The semiconductor memory device of claim 14, wherein
a channel resistance of the semiconductor film is independently controlled by a voltage that is applied to the first gate electrode, and a voltage that is applied to the second gate electrode.

16. The semiconductor memory device of claim 13, wherein
the first field effect transistors in all the semiconductor memory cells are turned off in the reset operation.

17. The semiconductor memory device of claim 15, wherein
when writing data to each of the semiconductor memory cells in the selected row, the select switching elements of the semiconductor memory cells in every row located closer to the bit line than the selected row are turned on.

18. The semiconductor memory device of claim 16, wherein
when writing data to each of the semiconductor memory cells in the selected row, the select switching elements of the semiconductor memory cells in every row located closer to the source line than the selected row are turned on.

19. The semiconductor memory device of claim 13, wherein
when writing data to each of the semiconductor memory cells in the selected row, a voltage applied in the reset operation is applied the first gate electrodes of the semiconductor memory cells in every row located closer to the bit line than the selected row.

20. The semiconductor memory device of claim 13, wherein
the second field effect transistor is of a normally-on type.

21. The semiconductor memory device of claim 13, wherein
the reset operation is performed by turning on the select switching elements of all the semiconductor memory cells, applying a first voltage to all the bit lines, and applying a second voltage to the first gate electrodes of all the semiconductor memory cells.

22. The semiconductor memory device of claim 13, wherein
a drive voltage of the first field effect transistor is equal to that of the second field effect transistor.

* * * * *